(12) United States Patent
Bernsen et al.

(10) Patent No.: US 12,393,800 B2
(45) Date of Patent: Aug. 19, 2025

(54) MULTIPLE APPLICATION QR CODE

(71) Applicant: KONINKLIJKE PHILIPS N.V., Eindhoven (NL)

(72) Inventors: Johannes Arnoldus Cornelis Bernsen, Eindhoven (NL); Oscar Garcia Morchon, Eindhoven (NL)

(73) Assignee: Koninklijke Philips N.V., Eindhoven (NL)

( * ) Notice: Subject to any disclaimer, the term of this patent is extended or adjusted under 35 U.S.C. 154(b) by 0 days.

(21) Appl. No.: 18/726,163

(22) PCT Filed: Dec. 22, 2022

(86) PCT No.: PCT/EP2022/087384
§ 371 (c)(1),
(2) Date: Jul. 2, 2024

(87) PCT Pub. No.: WO2023/126287
PCT Pub. Date: Jul. 6, 2023

(65) Prior Publication Data
US 2025/0068867 A1    Feb. 27, 2025

(30) Foreign Application Priority Data
Jan. 3, 2022  (EP) ..................... 22150029

(51) Int. Cl.
*G06K 7/10* (2006.01)
*G06K 19/06* (2006.01)

(52) U.S. Cl.
CPC ... *G06K 7/10366* (2013.01); *G06K 19/06037* (2013.01)

(58) Field of Classification Search
CPC .................................................. G06K 7/10366
(Continued)

(56) References Cited

U.S. PATENT DOCUMENTS

2013/0126601 A1   5/2013   Lee
2017/0193260 A1*  7/2017   Prusik ................ G06K 19/0614
(Continued)

OTHER PUBLICATIONS

Device Provisioning Protocol—Technical Specification—Version 3.0 Wi-Fi Alliance, 2022 https://www.wi-fi.org/system/files/Wi-Fi_Easy_Connect_Specification_v3.0.pdf.
(Continued)

*Primary Examiner* — Toan C Ly

(57) ABSTRACT

The present invention relates to a multiple application QR code capable of storing information of a plurality of applications in such a way that a respective information can be retrieved for each application in a reliable and time-efficient manner. The information is encoded into encoded data including at least a header and a respective data container per application. The header can comprise at least a single identifier indicating a presence of the plurality of applications and a respective application identifier per application. The encoded data are distributedly stored in a plurality of data pixels distributed over an encoding region of the QR code, according to an allocation rule. A QR code reader can retrieve the information stored in the QR code by only accessing and processing the data pixels associated with the respective application of interest and by using an error correction which is specific to this respective application.

18 Claims, 11 Drawing Sheets

| ... | ... | ... | ... | ... | ... | ... |
|---|---|---|---|---|---|---|
| ... | A | B | A | B | A | ... |
| ... | B | A | B | A | B | ... |
| ... | A | B | A | B | A | ... |
| ... | B | A | B | A | B | ... |
| ... | A | B | A | B | A | ... |
| ... | ... | ... | ... | ... | ... | ... |

(58) Field of Classification Search
USPC .................................................. 235/462.1
See application file for complete search history.

(56) References Cited

U.S. PATENT DOCUMENTS

| | | |
|---|---|---|
| 2017/0214353 A1 | 7/2017 | Chuang |
| 2019/0102588 A1 | 4/2019 | Lin |
| 2021/0326417 A1 | 10/2021 | Cabrera |

OTHER PUBLICATIONS

ISO/IEC 18004:2015: Information technology—Automatic identification and data capture techniques: "QR Code bar code symbology specification".

International Search Report for PCT/EP2022/087384 filed Dec. 22, 2022.

* cited by examiner

|  | ... | ... | ... | ... | ... | ... | ... |
|---|---|---|---|---|---|---|---|
|  | ... | A | B | A | B | A | ... |
|  | ... | B | A | B | A | B | ... |
|  | ... | A | B | A | B | A | ... |
|  | ... | B | A | B | A | B | ... |
|  | ... | A | B | A | B | A | ... |
|  | ... | ... | ... | ... | ... | ... | ... |

Fig. 3

|  | ... | ... | ... | ... | ... | ... | ... |
|---|---|---|---|---|---|---|---|
|  | ... | A | B | C | A | B | ... |
|  | ... | B | C | A | B | C | ... |
|  | ... | C | A | B | C | A | ... |
|  | ... | A | B | C | A | B | ... |
|  | ... | B | C | A | B | C | ... |
|  | ... | ... | ... | ... | ... | ... | ... |

Fig. 4

| ... | ... | ... | ... | ... | ... | ... | ... | ... | ... |
|---|---|---|---|---|---|---|---|---|---|
| ... | A | B | A | B | A | B | A | B | A | ... |
| ... | B | A | B | A | B | A | B | A | B | ... |
| ... | A | B | I | I | I | I | I | B | A | ... |
| ... | B | A | I | I | I | I | I | A | B | ... |
| ... | A | B | I | I | CI | I | I | B | A | ... |
| ... | B | A | I | I | I | I | I | A | B | ... |
| ... | A | B | I | I | I | I | I | B | A | ... |
| ... | B | A | B | A | B | A | B | A | B | ... |
| ... | A | B | A | B | A | B | A | B | A | ... |
| ... | ... | ... | ... | ... | ... | ... | ... | ... | ... |

Fig. 5

MULTIPLE APPLICATION QR CODE

CROSS-REFERENCE TO PRIOR APPLICATIONS

This application claims the priority benefit under 35 U.S.C. § 371 of International Patent Application No. PCT/EP2022/087384, filed on Dec. 22, 2022, which claims the priority benefit of European Patent Application No. 22150029.1, filed on Jan. 3, 2022, the contents of which are herein incorporated by reference.

FIELD OF THE INVENTION

The invention relates to the field of QR codes, and more specifically to a multiple application QR code.

BACKGROUND OF THE INVENTION

A Quick Response (QR) code, see [ISO 18004], also referred to as a two-dimensional barcode, is a machine-readable optical label encoding information which can then be decoded by a QR code reader or scanning device. For example, a handheld device such as a smartphone may be equipped with a QR code reader and an optical camera which may capture an image of the QR code and decode it to identify the encoded information. A QR code can be used for many applications. For example, a QR code may be printed on a poster and when a user scans the QR code, e.g., a browser on the QR code reader opens a web site with more information on the poster subject. In another example, a company may print a QR code on its product with the QR code containing, e.g., a serial number of the product that may then be used by an application of that company to register the product or to communicate with the product using said serial number.

It is common to connect devices to wireless networks such as those using Wi-Fi (i.e. IEEE 802.11-based). Where the devices to be connected lack or have only very basic user interfaces, it is common to use another device to assist with setting up the connection. Part of the setup, or configuring process involves boostrapping. An example of this is Wi-Fi Easy Connect, which supports a Device Provisioning Protocol (DPP) scheme, see [DPP]established by the Wi-Fi Alliance and uses QR codes to bootstrap secure Wi-Fi connections between Wi-Fi devices. Such setting-up protocols are usually called 'commissioning'.

A product can contain several QR codes for several different applications. For example, a wireless product, e.g., a Wi-Fi product, might also be, e.g., a Bluetooth Low Energy (BLE) product, or a IEEE 802.15.4-based product, and so on. Such a product may need a first QR code to get connected to the Wi-Fi network by means of a first commissioning protocol, e.g., Wi-Fi Easy Connect, and a second QR code other than the first QR code to enroll by means of a second commissioning protocol in another network like a smart home network (SHS) such as Matter over Wi-Fi frames. However, it may be problematic for a user to scan the right QR code for a particular application, e.g., a commissioning protocol, since the user has to figure out which QR code is to be used for which application. Furthermore, in the case of a wireless product supporting both Wi-Fi Easy Connect and the SHS, the product will also implement the commissioning protocols of both Wi-Fi Easy Connect and the SHS. Since both commissioning protocols rely on or are exchanged over Wi-Fi frames, the product needs to choose which commissioning protocol needs to be used based on the initial interaction triggered by a commissioning tool. However, this behavior is not defined. A similar issue will appear in other wireless products implementing two or more commissioning protocols over the same wireless interface.

Furthermore, in such circumstances, the information contained in multiple QR codes may be required by one of the applications with the consequence that it is not sufficient to scan a single QR code. Indeed, there are more and more, instances where it is necessary to scan several QR codes, each containing related information. Scanning each QR code is inefficient and costs time when a single scanning operation would be much quicker. One such instance is during documentation checks for passengers travelling in groups. The scanning of a QR code for each individual may lead to significant lengthening of queues and frustration for all involved.

SUMMARY OF THE INVENTION

It is an object of the present invention to store information of multiple applications in a QR code in such a manner that the respective information of each application can be then retrieved individually in a reliable and time-efficient manner. It is a further object of the present invention to coordinate the operation of commissioning protocols running over a same communication interface based on the retrieved information from a QR code.

This object is achieved by an encoding method as claimed in any of claims 1 to 9, by a decoding method as claimed in any of claims 10 to 12, by an encoding apparatus as claimed in claim 13, by a decoding apparatus as claimed in claim 14, by a device as claimed in claim 15, by a system as claimed in claim 16, and by a respective computer program product as claimed in claims 17 and 18.

According to a first aspect directed to encoding information of a plurality of applications for storage in a first QR code, a method comprises at least collecting the information of the plurality of applications, and encoding the information into encoded data, the encoded data including at least a header and a respective data container per application. The header comprises at least a single identifier indicating a presence of the plurality of applications and a respective application identifier per application. Thus, the identification information indicated by the header for the respective applications and data containers allows supporting multiple applications on the same (first) QR code. In the following disclosure, the first QR code, i.e., a QR code capable of handling multiple applications, may be interchangeably designated also as a master code.

In an example of the first aspect, a respective error correction mechanism (ECM) and/or detection mechanism (EDM) is used for each data container per application in the encoded data of the respective data container per application. Thereby, the provision of an ECM and/or EDM per data container enables fast reading of data of a respective application in the first QR code in a reliable manner. In an example of the first aspect, the step of encoding the information into encoded data comprises at least converting an input data stream of the information into a respective input bit string for each application, splitting the respective input bit string for each application into a sequence of one or more data codewords, dividing the sequence of one or more data codewords into a predefined number of blocks, generating one or more error correction codewords for each block, and including the error correction codewords in the data codeword sequence. For example, the error correction codewords may be inserted in any suitable place or places in the data codeword sequence. Thereby, there are error correction capabilities per application. In an example, the data and error correction codewords may have a 8-bit length or otherwise another length in bits.

In an example of the first aspect, the step of encoding the information into encoded data comprises at least taking a respective data stream from the header for each application, combining the respective data stream into a combined data respective stream, converting the combined respective data stream into a respective input bit string, splitting the respective input bit string into a sequence of one or more data codewords, dividing the sequence of one or more data codewords into a predefined number of blocks, generating one or more error correction codewords for each block, and including the error correction codewords in the data codeword sequence. For example, the error correction codewords may be inserted in any suitable place or places in the data codeword sequence. Combining the respective data stream may include concatenating the respective data streams.

In an example of the first aspect, the method can further comprise distributedly storing a part or an entirety of the encoded data in a plurality of data pixels distributed over an encoding region of the first QR code, according to an allocation rule, wherein a data pixel is defined as a data storage unit in the QR code. Thereby, any localized damage of the first QR code can be spread over the plurality of applications, which ensures less damage per application and a higher probability of full correction per application. In addition, this allows a QR code reader to read only the application data of a respective application, which speeds up the reading process.

In an example of the first aspect, the method, when comprising distributedly storing a part of the encoded data, further comprises storing another part of the encoded data in a second QR code other than the first QR code. Thereby, the storage of the encoded data for the plurality of applications can be shared with other QR codes in order to optimize the data storage resources.

In an example of the first aspect, respective error detection or correction data from an error detection or correction mechanism, used per application, is included in each data container per application. Thereby, errors in the encoded data of the respective data container can be detected or corrected.

In an example of the first aspect, the encoded data includes: data arranged for use with an overall error detection mechanism shared by all applications of the plurality of applications for detecting whether there are errors in the respective data container based on information (e.g., codewords) in other data containers, and/or data arranged for use with an overall error correction mechanism shared by all applications of the plurality of applications for correcting errors in the respective data container based on information (e.g., codewords) in other data containers. Thereby, the error detection and correction capabilities can be enhanced.

In an example of the first aspect, the header further comprises a respective application length parameter for each application. Thereby, information about how data in bits are stored in the first QR code for each application can be indicated in order to avoid or at least mitigate any waste of data resources, e.g., in the case where the storage capacity of the first QR code is assumed to be divided equally between the plurality of applications although some applications require more than half of the storage capacity of the first QR code.

In an example of the first aspect, the input bit string includes a part of the header that is related to the respective application. Thereby, the information in the header that is related to a respective application can be included in the application data, so that the concerned part of the header can be protected from errors by means of the error correction capabilities of the respective application. Thus, parity bits or error correction bits in the respective application might protect certain fields in the header.

In an example of the first aspect, the method further comprises collecting image data from a graphical representation being physically superimposed on the first QR code, and including, in the header of the encoded data, an indication of a presence of the graphical representation and of an area occupied by the graphical representation on the first QR code, wherein the data pixels of the encoding region of the first QR code that occupy an area in the first QR code coinciding with the area occupied by the graphical representation are excluded from storing the part or the entirety of the encoded data. Thereby, a larger graphical representation (e.g., letter, figure, picture, logo, icon, design, pattern, model, and so on) than by using the method of deliberately introducing errors in the encoded data can be superimposed on the first QR code since the error correction capabilities of the first QR code to correct the errors introduced by the superimposed graphical representation can be preserved.

In an example of the first aspect, the method further comprises configuring the respective error correction mechanism per application with a lower error correction level than the single error correction mechanism shared by all applications of the plurality of applications. This configuration information might be stored in the header or in the data containers. From the list of the known levels L, M, Q, H of error correction, the ECM per application could have, e.g., the lowest error correction level L, whereas the ECM shared by all applications of the plurality of applications could have e.g., the highest error correction level H. In the case where the first QR code employs Reed-Solomon error control coding as error correction mechanism, the four error correction levels L, M, Q, H offer a respective capability of recovery of about 7%, 15%, 25%, 30%.

In an example of the first aspect, the first QR code comprises device provisioning protocol (DPP) or Wi-Fi Easy Connect bootstrapping information for storing information at least of a public key. Thereby, in the case where a respective Wi-Fi connection can be established between a plurality of configurators and an enrollee to which the first QR code is attached, each configurator scanning the first QR code of the enrollee during the boostrapping process can retrieve its respective public key, e.g., its public identity key.

According to a second aspect directed to decoding information of a respective application amongst a plurality of applications in a first QR code, wherein the information is stored as encoded data in the first QR code and the encoded data includes at least a header and a respective data container per application, the method comprising at least: reading a header of the first QR code, the header including at least a single identifier indicating a presence of the plurality of applications and a respective application identifier per application; identifying, from the header, the first QR code by using the single identifier indicating the presence of the plurality of applications; identifying, from the header, the respective application; and identifying the respective data container associated with the respective application. In an alternative, the first QR code can be visually identified, for example, by means of a user-understandable printed pattern (e.g., a letter M for designating a master or Matter-based QR code), so that the identification can be performed by the person handling, e.g., the QR code reader.

In an example of the second aspect, the method further comprises reading all those pixels associated with the data container of the respective application to retrieve at least one data codeword associated with the respective application and parity or error detection or error correction bits for all the plurality of applications, and obtaining error-free application data of the respective application. Thereby, the information of a respective application amongst the plurality of applications can be selectively retrieved, e.g., by a decoding apparatus such as a QR code reader, in a reliable manner without requiring to read all the data pixels of the first QR code but only those data pixels for the respective application, which allows to speed up the reading process.

In an example of the second aspect, the method further comprises selecting an application amongst the plurality of applications based on a preconfigured application or a policy or a context, and using the decoded information from the respective application to start an application or protocol. For example, the application or protocol to be started may be a commissioning application for a wireless product. To illustrate said preconfiguration, the QR code reader may for example be from a manufacturer which will preconfigure to only use a specific application, e.g., an SHS such as Matter. But if the QR code reader is for example from another manufacturer which uses Wi-Fi, this other manufacturer may not know whether the end user uses a Wi-Fi Network or a SHS network and the choice may depend on the context.

In an example of the second aspect, the method further comprises selecting an application of the plurality of applications as a first commissioning application from the first QR code, retrieving commissioning data related to the selected first commissioning application, starting the first commissioning application, and executing the first commissioning application until the first commissioning application either succeeds or fails. If the first commissioning application fails, the method comprises selecting another application of the plurality of applications as a second commissioning application from the first QR code, retrieving commissioning data related to the second commissioning application, and starting the second commissioning application. Thereby, the combination of multiple commissioning applications can be avoided.

In an example of the second aspect wherein the information encodes commissioning information for a communication protocol, the method further comprises selecting a first commissioning protocol based on at least one of a preconfigured value, a policy, a context, and a part of the data in the first QR code.

In an example of the second aspect, the first protocol is started, and a second protocol is not triggered as long as the first protocol is not finished.

In an example of the second aspect, the method comprises reading the first QR code, determining the supported applications of the plurality of applications from the read first QR code, choosing an application amongst the supported applications based on at least one of: a preconfigured choice, a policy, a context, and a preference included in the first QR code, and starting the chosen application as a first chosen application. In the case of a commissioning application, the configurator or commissioner should not start a second chosen application as long as the first chosen application has not succeeded or has failed, e.g., as long as the commissioning process associated with the first chosen application has not succeeded or has failed, a minimum number N of times, e.g., N=1, 2, . . . .

In an example of the second aspect, the method comprises reading the first QR code, determining the supported applications of the plurality from the read first QR code, choosing an application execution order based on at least one of: a preconfigured choice, a policy, a context, and a preference included in the first QR code, starting a first application (in the case of a commissioning application, the configurator or commissioner should not start a second chosen application as long as the first chosen application has not succeeded or has failed, at least, until a preconfigured target step, e.g., as long as the commissioning process associated with the first chosen application has not succeeded or has failed, a minimum number N of times, e.g., N=1, 2, . . . ), and upon successful (possibly partial in the case where a second commissioning protocol may rely on a first commissioning protocol (DPP) as a intermediate step) execution of the first application, starting a second application. An example of the latter use of two applications may be to use a first commissioning protocol (DPP) as a intermediate step) execution of the first application for enrolling the device in a Wi-Fi network instead of using the second application for that and using the second application to connect the device to e.g. a cloud service or some back-end in the cloud. An advantage of this may e.g. be that the first application offers a more secure way to connect to a Wi-Fi network than the second application, while the first application does not offer a connection to a or to the right cloud service.

According to a third aspect directed to an apparatus for encoding information of a plurality of applications for storage in a first QR code, the apparatus is adapted to perform the method as claimed in the first aspect and/or in any of the examples of the first aspect.

According to a fourth aspect directed to an apparatus for decoding information of a respective application amongst a plurality of applications in a first QR code, wherein the information is stored as encoded data in the first QR code and the encoded data includes at least a header and a respective data container per application, the apparatus is adapted to perform the method as claimed in the second aspect and/or in any of the examples of the second aspect.

According to a fifth aspect directed to a device having an associated QR code, the QR code including commissioning information for two different commissioning protocols, the device, upon reception of an initial commissioning message of a first commissioning protocol from a commissioner device, accepts no initial commissioning message of a second commissioning protocol until the first commissioning protocol finishes.

According to a sixth aspect directed to a system, the system comprises at least: the apparatus as claimed in the fourth aspect comprising a camera and a first communication interface; a first device having an associated QR code and a second communication interface; a second device having a third communication interface; and a third device, wherein the apparatus is adapted to interface with the third device and start and execute a first commissioning protocol with the first device, and/or wherein the third device is adapted to trigger a second commissioning protocol, either identical to or different from the first commissioning protocol, with the first device from the second device.

According to a seventh aspect directed to a computing device, a computer program product comprises program instructions or code means such that, when the computer program product is run on a processing unit of the computing device, the computing device is arranged to perform the method as claimed in the first aspect and/or in any of the examples of the first aspect.

According to an eighth aspect directed to a computing device, a computer program product comprises program instructions or code means such that, when the computer program product is run on a processing unit of the computing device, the computing device is arranged to perform the method as claimed in the second aspect and/or in any of the examples of the second aspect.

It is noted that the above apparatuses may be implemented based on discrete hardware circuitries with discrete hardware components, integrated chips, or arrangements of chip modules, or based on signal processing devices or chips controlled by software routines or programs stored in memories, written on a computer readable media, or downloaded from a network, such as the Internet.

It shall be understood that a preferred embodiment of the invention can also be any combination of the dependent claims or above embodiments with the respective independent claim.

These and other aspects of the invention will be apparent from and elucidated with reference to the embodiments described hereinafter.

BRIEF DESCRIPTION OF THE DRAWINGS

For a better understanding of the present application, reference will now be made by way of examples to the accompanying drawings in which:

FIG. 3 shows a schematic allocation of data pixels of a QR code to encoded data for two applications, according to an embodiment of the present invention;

FIG. 4 shows a schematic allocation of data pixels of a QR code to encoded data for three applications, according to an embodiment of the present invention;

FIG. 5 shows a schematic allocation of data pixels of a QR code to encoded data for two applications in the presence of a picture, according to an embodiment of the present invention;

DETAILED DESCRIPTION OF EMBODIMENTS

Embodiments of the present invention will be described based on a QR code, in particular a QR code capable of handling multiple applications or implementations.

Figure 1:
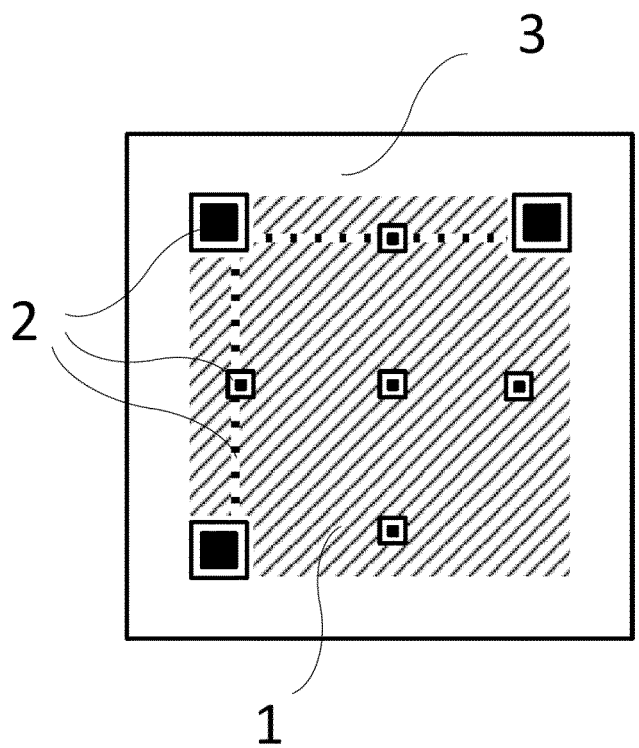
FIG. 1 shows a structure of a version 7 QR code symbol according to a conventional embodiment.

The International Organization for Standardization (ISO) has established a standard ISO/IEC18004:2015 for the QR code entitled: "Information technology—Automatic identification and data capture techniques—QR code bar code symbology specification", which defines the standardized symbol structure of a QR code as follows. A QR code symbol is constructed as a two-dimensional array of light and dark squares, referred to as modules. There are forty sizes of QR code symbol versions ranging from version 1 to version 40. Each QR code symbol version is comprised of a different number of modules, and as such different QR code versions give rise to different data capacities. Taken from FIG. 3 in paragraph 6.3.1 of the standard ISO/IEC18004:2015, FIG. 1 of the present application depicts a structure of a version 7 QR code symbol that consists of encoding regions 1, (i.e., format information, version information, data codewords and error correction codewords), and function patterns 2 (i.e., finder, separator, timing patterns, and alignment patterns). The function patterns do not encode data and the symbol is surrounded on all four sides by an empty region denoted as the quiet zone 3. FIG. 1 of the present application depicts a structure of a version 7 QR code symbol that consists of encoding regions 1, (i.e., format information, version information, data codewords and error correction codewords), and function patterns 2 (i.e., finder, separator, timing patterns, and alignment patterns). The function patterns do not encode data and the symbol is surrounded on all four sides by an empty region denoted as the quiet zone 3.

Message data are encoded as a bit stream which is divided into a sequence of codewords. All codewords are 8-bits in length. The codewords are grouped into a number of error correction blocks based on the QR code version and error correction level, and an appropriate number of error correction codewords are generated for each block. Error correction mechanism (ECM) allows correct decoding of the message in the event that a part of the symbol is dirty or damaged. The QR code of the standard ISO/IEC18004:2015 employs Reed-Solomon error control coding for error detection and correction. It is known that the Reed-Solomon code is a [n, k, n−k+1]code, that is a linear block code of length n (over a finite field) with dimension k and minimum Hamming distance equal to n−k+1. The Reed-Solomon code (such as any MDS code) is able to correct twice as many erasures (i.e., erroneous codewords at known locations) as errors (i.e., erroneous codewords at unknown locations), and any combination of errors and erasures can be corrected as long as the relation $2E+S \leq n-k$ is satisfied, where E is the number of errors and S is the number of erasures in the block. Further examples of these ECMs can include Hamming codes or low-density parity check codes. There are four error correction levels L, M, Q, H that the user can select. Each level provides a different error correction capacity: L up to 7%, M up to 15%, Q up to 25%, and H up to 30%. Higher error correction levels improve the recovery capacity, but also increases the amount of encoded data, or the amount of parity symbols. This means that if the same message were to be encoded using a higher error correction level, a larger QR code version may be required. The number of data codewords, error correction blocks and error correction codewords depends on the QR code version and error correction level.

In an example embodiment of the present invention, a first QR code, affixed to an object, a product, or a device, is used to store encoded data for a plurality of applications (or implementations). It should be noted that, to make a distinction with a QR code storing encoded data for a single application, the term "Master QR code" may be used in the description to interchangeably designate the first QR code, i.e., a QR code storing encoded data for a plurality of applications. The first QR code can contain information of the plurality of applications in an encoded form. The wording "for an application" may be understood herein to mean "arranged for use with an application".

Information of a respective application can be any set of characters that can for example represent in a non-exhaustive manner at least one of: the name of the application (e.g., "URL to company X", or "Wi-Fi network configuration"), an identifier which uniquely identifies the respective application, configuration data for the OA, the URL to the app or program to use for that QR code and application, and the location of the QR for the respective application (e.g., "the QR code pointed to by the green arrow", or "the QR code indicated by the blue rectangle", or "the QR code to the right of the on/off switch").

The encoded data from the encoded information can include at least a header and a respective data container per application. The header may comprise a single identifier indicating a presence of the plurality of applications, and a count of the plurality of applications and a respective application identifier per application. The single identifier may implicitly indicate the presence of a plurality of (specific) applications, e.g., two applications related to Wi-Fi Easy Connect and an SHS. A data container can contain the application data of an application and refer to those data pixels of the first QR code that are reserved to store the application data. In an additional embodiment, the data container can also refer to the physical locations in the first QR code which are used to store the application data. A data container might also refer to a part of a bit string containing the data associated with an application.

It should be noted that, in the present invention, the term "data pixel" refers to a storage unit in a QR code. For example, if a "data pixel" is the smallest possible storage unit in the QR code, then it is only capable to store a certain amount of bits, e.g., 1 bit. In the example case where a "data pixel" would refer to a data storage unit capable of storing b bits in a QR code capable of storing D bits, then the QR code could store D/b "data pixels". Thus, the term "data pixel" should not be confused with the term "picture pixel". For example, the image of a QR code consists of picture pixels upon capture by a camera, while groups of one or more picture pixels may represent respective data pixels.

A respective ECM (e.g., Reed-Solomon codes, Hamming codes, low-density parity check codes, and such like) may be included in each data container per application for correcting any error in the encoded data of the respective data container per application, thereby allowing fast reading of the application data in the first QR code containing encoded data for use with more than a single application. In particular, if a respective application, denoted by OAi, requires encoding application data Di, an ECM is used to map Di to a codeword Ci. The ECM can retrieve Di from Ci even if Ci has some errors. The application data Di can be first divided into b blocks so that a total of b codewords can be obtained. To reduce any risk of damage caused to the application data, the bits or symbols of these different codewords can be interleaved, i.e., mixed, so that, if a burst of errors occurs (e.g., due to a damage caused to a physical area of the QR code), the errors are then distributed over multiple codewords.

In an optional embodiment, a respective error detection mechanism (EDM) (e.g., Cyclic Redundancy Check (CRC), Parity Check, Checksum, and such like) or a respective error correction mechanism (ECM) may be included in each data container per application for detecting or correcting errors in the encoded data of the respective data container per application.

In an optional embodiment, the encoded data may include an overall EDM shared by all applications of the plurality of applications for detecting errors in a data container based on information in one or more of the other data containers.

In an optional embodiment, the encoded data may include an overall ECM shared by all applications of the plurality of applications for correcting any error in a data container based on information in one or more of the other data containers.

Figure 2:
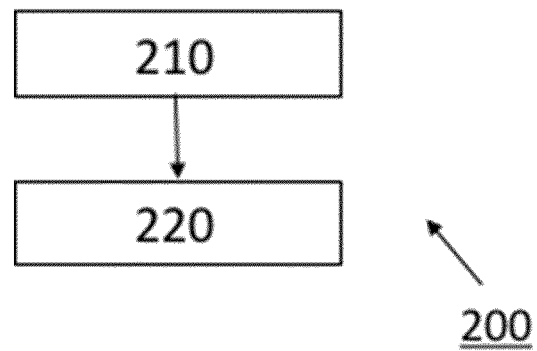
FIG. 2 shows a schematic flowchart describing an example encoding procedure according to an embodiment of the present invention.

FIG. 2 shows a schematic flowchart 200 describing an example encoding method of encoding information of the plurality of applications for storage in the first QR code, according to an example embodiment of the present invention.

At step 210, information of a plurality of applications is collected.

At step 220, the information is encoded into an encoded data, the encoded data including at least a header and a respective data container per application. The header can comprise a single identifier indicating a presence of the plurality of applications, and a count of the plurality of applications and a respective application identifier per application.

In a detailed example referring to the above encoding method of FIG. 2, the information of the plurality of applications, each application being associated with a data container, for storage in the first QR code can be encoded into the above-mentioned encoded data according to the following example method using the ECM and optionally the EDM shared by all data containers and the header. It should be noted that in this example, a single QR code can contain information to multiple applications.

At a first step, input data related to the first QR code (i.e., the master QR code) are collected. The input data can thus include at least a count of the plurality of applications, and a respective application identifier per application. In the example case of N applications referred to as OA1, ..., OAN, these input data denoted as the header data (HD) may be structured as follows: N, OA1, ..., OAN. It should be noted that the respective application identifiers are each unique, e.g., by registering or standardizing them. In the example case of two applications with identifiers OA1 and OA2, the content of the header might be explicitly structured as "2, OA1, OA2", or alternatively, a single identifier (ID) might be included in the header that implicitly means "2, OA1, OA2". The header may also be used to indicate an order of use of the containers.

It should be noted that the above input data do not give any information about how many data in bits are stored for each application. In this case, as aforementioned, for a QR code with a given storage capacity, the QR code reader might need to assume that the storage capacity is divided equally between the number of available respective applications. This can lead to a waste of resources, e.g., when one application requires very little data storage, and another application much more, and in particular, slightly more than half of the storage capacity of a given QR code type. In this case, if the length is not included, these two respective applications would need to be encoded in a larger QR code. To avoid this problem, in an optional embodiment, the header data (HD) may also include length parameters for each application and be thus structured as follows: N, OA1, . . . , OAN, L1, . . . , LN.

At a second step, for each of the N respective applications, application data Di (i.e., the characters in Di) of the respective application OAi are collected.

At a first sub-step of the second step, a respective bit stream data (BSD) from Di (i.e., an input bit string BSDi from Di) is computed. It should be noted that the input string might also include a part of the header data (HD) related to the respective application OAi, e.g., the OAi identifier and the position of the respective application OAi in the list of the N applications, or the length Li for the respective application OAi. The benefit to include this HD information in the input bit string BSDi is to protect it from errors by means of the ECM and optionally the EDM associated with the respective application. In other words, parity bits in the application data of the respective application may protect certain fields in the header. Furthermore, to enhance the reliability of the header, two options taken singly or in combination may be proposed. In a first option, the header may, e.g., include its own error correction capabilities in such a manner that any error may be corrected before the header accesses the input bit string BSDi. In a second option, the header information may, e.g., also be physically stored in pixels close to one, two, or three "Eyes" or "Position Markers" or "the Square-within-Squares-at-three-corners". The reason is that these position markers are required to identify and position a QR code. This is similar to the format information and version information shown in FIG. 1. Thus, if the position markers are removed or damaged, the QR code will not be readable in any case. However, if the header information is placed, e.g., at some known physical locations close to one or multiple position markers, then there is an increased likelihood that the header information can be read.

At a second sub-step of the second step, an error detection bit string EDi, e.g., a CRC, is optionally computed from the input bit string BSDi in the case where the EDM is CRC-based.

At a third sub-step of the second step, an interleaved input bit string BSDi, denoted by IBSDi, is optionally obtained by interleaving EDi and BSDi to spread potential errors. It should be noted that the QR code reader must know if and how interleaving is done. This can be based on a standard or might be stored explicitly or implicitly, e.g., in the header. This also applies to other interleaving steps in other embodiments of the present invention.

At a fourth sub-step of the second step, one or more 8-bit codewords Ci are computed by splitting the interleaved input bit string IBSDi into a sequence of one or more 8-bit data codewords, by dividing the data codeword sequence into a required number of blocks (depending on the QR code version and on the error correction level L, M, Q, H) to enable the ECM (e.g., the Reed-Solomon code) to be processed, by generating one or more 8-bit error correction codewords for each block, and by appending the error correction codewords to the end of the data codeword sequence or inserting the error correction codewords in any suitable place or places in the data codeword sequence.

It should be noted that this fourth sub-step reveals that there is error correction capabilities per OA. If we stored application data of two applications OA1, OA2, with a single error correction bit string used for all application data, the total storage requirements would be D=D1+D2+PB, where D1 and D2 respectively refer to the application data of OA1 and OA2, and PB refers to the parity bits for all two applications OA1 and OA2 and is required for error correction. In contrast, in the present fourth sub-step, if we have to store, e.g., application data of two applications OA1, OA2, there will be an error correction bitstring applying to the respective application data of OA1 and OA2. This means that the total storage requirements will no longer be D but D'=D1+D2+PB1+PB2, where D1 and D2 respectively refer to the application data of OA1 and OA2, PB1 refers to the parity bits for the application OA1, and PB2 refers to the parity bits for the application OA2. Although D' may be greater than D, a QR code reader only needs to read D1+PB1 if it is interested in the application OA1 or D2+PB2 if it is interested in the application OA2, and this sum D1+PB1 or D2+PB2 is expected to be smaller than D.

At a fifth sub-step of the second step, the one or more 8-bit codewords Ci are optionally interleaved with themselves or with IBSDi or with a combination thereof to obtain interleaved codewords ICi for the respective application OAi.

It should be noted that the above sub-steps may be performed in a different order. For example, the fourth sub-step may follow the second sub-step and the third-sub-step may follow the fourth sub-step.

At a third step, given the respective interleaved codewords ICi for each of the N applications OA1, . . . , OAN, and optionally the header data (HD) in the case where the above input string also includes a part of the HD related to the respective application OAi, the concatenation TIC of IC1, . . . , ICN, and optionally of HD, is obtained.

At a first sub-step of the third step, EDTIC is optionally obtained by applying an second EDM to compute an error detection bit string ED (e.g., a CRC) which allows errors in TIC to be detected, and by appending the error detection bit string ED to the ICs as to obtain: EDTIC=TIC|ED.

At a second sub-step of the third step, IEDTIC is optionally obtained by interleaving ED and TIC to spread any potential error. In an example case, interleaving may interleave a part of ED in each IC and/or the whole ED in each IC.

At a third sub-step of the third step, parity bits (PB) are optionally obtained by applying a second ECM to compute one or more 8-bit codewords over IEDTIC, and optionally over HD|IEDTIC. It should be noted that the second ECM must not modify the ICi themselves. For example, the second ECM may consist in computing parity bits (PB) which can be appended to IEDTIC.

At a fourth sub-step of the third step, the parity bits (PB) computed by the second ECM are optionally distributed (e.g., by means of interleaving) among the respective interleaved codewords ICi for each application OAi. For example, assume that k parity bits (PB) are obtained and there are two applications OA1 and OA2, then the k parity bits may be distributed in the data containers associated with these two applications OA1 and OA2 (e.g., k−x bits for the data container associated with OA1 and x bits for the data container associated with OA2). In an example variant, the k parity bits may be stored in both data containers. Those selected parity bits (PB) to be stored in a data container per application shall be distributed over the ICi of the respective application.

In an example embodiment, the ECM per application (i.e., the ECM per data container) may be configured with a lower error correction level than the single ECM shared by all applications of the plurality of applications (e.g., the second ECM). For example, from the list of the known levels L, M, Q, H of error correction, the ECM per application could have the lowest error correction level L, whereas the ECM shared by all applications of the plurality of applications could have the highest error correction level H. In the case where the first QR code employs Reed-Solomon error control coding, the four error correction levels L, M, Q, H offer a respective capability of recovery of about 7%, 15%, 25%, 30%. This can allow for fast reading of application data of a respective application since less application data are involved.

In an optional embodiment, a part or an entirety of the encoded data may be distributedly stored in a plurality of data pixels distributed over the first QR code, more precisely over the encoding region of the first QR code, according to an allocation rule.

In an example case where the data storage resources of the first QR code are limited, the encoded data can be then stored in a plurality of different QR codes, e.g., the first QR code and a second QR code, such that a part of the encoded data is stored in the first QR code and the remaining part is stored in the second QR code instead of the entirety of the encoded data being stored in the first QR code.

In this case, the first QR code as master QR code can include a user-understandable printed pattern or patterns inside it indicating the location of the other QR codes (e.g., the second QR code) with respect to the master QR code. In an example, the user-understandable pattern or patterns can be one or more (colored) arrows pointing to each of the other QR codes (e.g., the second QR code) or can be a sort of checkerboard with (colored or numbered) rectangles denoting the master QR code and all the other QR codes (e.g., the second QR code).

The determination of those data pixels for distributedly storing the encoded data over the encoding region of the first QR code can be performed according to different allocation rules. It should be noted that the header data might be distributed similarly to the encoded data.

Assuming that the first QR code includes the application data of two applications, denoted by A and B, and the data capacity is shared equally between both respective data containers for the applications A and B, an example allocation rule can consist in storing the encoded data of the respective data containers (i.e., storing not only the encoded application data but also the parity, EDM or ECM bits) for the applications A and B in alternating data pixels in (the encoding region of) the first QR code as shown in FIG. 3.

Assuming that the first QR code includes the application data of three applications, denoted by A, B and C, and the data capacity is shared equally between the three respective data containers for the applications A, B and C, the example allocation rule can consist in storing the encoded data of the respective data containers (i.e., storing not only the encoded application data but also the parity, EDM or ECM bits) for the applications A, B and C in data pixels of (the encoding region of) the first QR code as shown in FIG. 4.

This example allocation rule ensures that a damage in a certain part of the QR code does not damage the encoded data for a respective application or a high percentage of these encoded data.

In another example allocation rule, the specific data pixels in the first QR code storing the encoded data of the respective data containers per application can be computed, e.g., as follows:

(1) if data pixels are identified by their cartesian coordinates (i,j),
(2) data pixels with identifier (i,j) in the coordinate system (I,J) are used for storing the encoded data of the respective data containers per application,
(3) the first QR code has M×M data pixels (or elements), and
(4) the same amount of data pixels (or elements) is allocated to the encoded data for all applications,
(5) then the encoded data associated with the application number k, where 0≤k≤N−1, can be stored in those data pixels which satisfy, e.g., the following relationship (1):

$$(i*M + j)(\mathrm{mod}N) = k \text{ with } (i, j) \text{ in } (I, J) \tag{1}$$

If the respective applications have different storage needs, the data pixel allocation can take this into account. In particular, if N applications require length parameters of L1, L2, ..., LN bits for the encoded data of the respective data containers per application, then it is required to normalize the lengths by dividing all of them by the smallest one and by rounding the result upwards by means of the RoundUp( ) function, as given by the following relationship (2):

$$NL1, NL2, \ldots, NLN = RoundUp(L1/L\mathrm{min}), \tag{2}$$
$$RoundUp(L2/L\mathrm{min}), \ldots, RoundUp(LN/L\mathrm{min})$$

It should be noted that the usage of the RoundUp( ) function means that some or all respective applications can need to be appended with some dummy bits. The contents of the dummy bits could be chosen, e.g., such that the error correction capabilities are improved or that the clock regeneration is improved. For clarification, clock regeneration means determining where to sample the image containing a QR code that is possibly (optically) distorted and possibly rotated to obtain all of the pixels of the QR code. By enforcing run-length limitations in both directions of the QR code, the estimation of where the boundaries between the data pixels of the QR code are can be improved. Thus, the dummy bits should be chosen such that long run lengths in both directions above a certain threshold are prevented or even better, and such that the run lengths in both directions are minimized, e.g. by creating a checkerboard pattern of the data pixels of the QR code in the dummy bit areas. This is especially helpful if the QR code is printed on a curved surface.

In another example allocation rule, the data pixels of the first QR code can be used to store the encoded data of the respective data containers for the N different applications (indexed from 1 to N) in consecutive rounds:

Round 1:
  the first NL1 bits of encoded data for a first application are stored in the first NL1 bits of the first QR code,
  the first NL2 bits of encoded data for a second application are stored in the following NL2 bits of the first QR code,
  . . . ,
  the first NLN bits of encoded data for a N-th application are stored in the following NLN bits of the first QR code;

Round 2:
  the following NL1 bits of encoded data for the first application are stored in the following NL1 bits of the first QR code,
  the following NL2 bits of encoded data for the second application are stored in the following NL2 bits of the first QR code, ..., 
the following NLN bits of encoded data for the N-th application are stored in the following NLN bits of the first QR code, ...;

Round i:
the following NL1 bits of encoded data for the first application are stored in the following NL1 bits of the first QR code,
the following NL2 bits of encoded data for the second application are stored in the following NL2 bits of the first QR code,
...,
the following NLN bits of encoded data for the N-th application are stored in the following NLN bits of the first QR code.

In another example allocation rule, the specific data pixels in the first QR code storing the encoded data of the respective data containers per application can be computed, e.g., as follows:

(1) if data pixels are identified by their cartesian coordinates (ij),
(2) data pixels with identifier (i,j) in the coordinate system (I,J) are used for storing the encoded data of the respective data containers per application,
(3) the QR code has M×M pixels (or elements),
(4) define: $SNL\_k = NL1 + NL2 + \ldots + NLk$, where $k=1, 2, \ldots, N$ and NL1, NL2, ..., NLN are the normalized lengths of the encoded data for the respective applications as given by the relationship (2),
(5) then, based on SNL_k, data pixels (or elements) (i,j) in (I,J) are allocated to the encoded data associated with the application number k according to the following relationship (3):

$$SNL\_k \leq (i*M + j)(\text{mod} SNL\_N) < SNL\_\{k+1\} \quad (3)$$

It should be noted that the relationship (2) means that the normalized length of the smallest one becomes 1. The above scheme related to the relationship (1) also interleaves in groups of 1. It should be noted that the bits could also be interleaved in groups of k length with k>1, where each of the k bits are from one application. The bits of each respective application might be distributed over regions, e.g., square or rectangular regions, in the QR code. For example, the squares in the above figures might denote individual data pixels or rectangular regions containing data pixels of one application. The above-mentioned formulas might refer to rectangles i,j with s data pixels instead of only a single data pixel. It should be also noted that the areas may be not rectangular in shape, but may rather have another shape, e.g., triangular or diamond (i.e., rhombus with 4 corners with its axes in horizontal and vertical direction). It should be noted that having rectangles that are larger than 1 pixel, i.e., **1\*1**, makes it also possible to limit run length in both dimensions, thus minimizing sampling errors on curved or crumpled surfaces.

It should be noted that another way of dealing with the applications requiring different length parameters of L1, ..., LN bits for the encoded data of the respective data containers per application can be as follows: Let g denote the greatest common divisor of L1, ..., LN, that is the largest integer that divides all of L1, L2, ..., LN. The bitstream is partitioned into g parts, each part containing L1/g bits from a first application, L2/g bits from a second application and so on. In each part, the first L1/g bits correspond to the first application, the next L2/g bits to the second application, and so on. For example, if N=3 and L1=20, L2=30 and L3=40, then g=10. Each of the 10 groups has bits AABBBCCCC, where A, B and C indicate a bit from the respective first, second and third applications. A variant would be that, in each part, first one symbol from each application be placed, next a second symbol from each application with more than one symbol in each part being placed, and so on. In this case, instead of the above bit sequence AABBBCCCC, this would result in the bit sequence ABCABCBCC. The advantage of this other way is that it does not introduce dummy bits resulting from rounding upwards.

In an example embodiment, the encoded data for the respective applications that are to be stored in these above-computed data pixels can correspond to a combined bit string as defined in the following. The overall output bit string IC derived from the fifth sub-step of the second step is such that it contains a number of ICs corresponding to the total number of interleaved codewords ICi per application OAi (where i=1, 2, ..., N) for all of the N applications. At the second and third sub-steps of the third step, the error detection information (EDI) and error correction information (ECI) associated with all applications are distributed over all of the N applications. If the IC has a length L and the ECI/EDI has a length H, then the total length is Z=L+H. The bits of the ECI/EDI can be evenly distributed in the output bit string IC. This can be done as above-mentioned by normalizing L and H by dividing them by J=Min(L,H) to thus obtain: l=RoundUp(L/J) and h=RoundUp(H/J). The IC and ECI/EDI are then divided in blocks of l and h bits. The combined bit string is obtained by alternately concatenating l bit blocks and h bit blocks of IC and ECI/EDI. The combined bit string to be stored in the above-computed data pixels can then contain IC of an OA and the ECI/EDI from the whole QR code. It should be noted that, under the assumption that errors occur in a burst, e.g., errors due to a broken QR code or due to a hole in the QR code, the error correction capabilities allow a high likelihood of full correction per application to be maintained since only a fraction of each application is affected.

A current practice is to superimpose a graphical representation (e.g., letter, figure, picture, logo, icon, design, pattern, model, and so on) on a QR code, e.g., a picture of a company logo on the QR code. This helps the users to identify the purpose of the QR code more easily, e.g., whether it is a master QR code by superimposing a user-understandable printed pattern, e.g., the letter M. Superimposing a graphical representation (e.g., a picture) and still having a QR code which works is feasible since QR codes rely on error correction mechanism, and the error correction capabilities are thus used to correct any error introduced by the superimposed graphical representation. However, this works to some extent although it exists some limitations, e.g., the superimposed picture cannot be arbitrarily large since otherwise too many errors would be introduced that could not be corrected even if the strongest available error correction code is applied. An example embodiment addressing this issue refers to the first QR code including an indication that a graphical representation is superimposed on the first QR code in a given physical area of the first QR code. A solution may then be to exclude from data storage, the data pixels of the encoding region of the first QR code that occupy an area in the first QR code coinciding with the area occupied by the graphical representation. In an example, the indication may be included in the header information, which may, e.g., be physically stored in data pixels close to one, two, or three "Eyes" or "Position Markers" or "the Square-within-Squares-at-three-corners" of the first QR code, i.e., in data pixels not located in the central area of the first QR code where the graphical representation picture is usually located.

In an example, the area may be specified by listing the data pixels of the first QR code that are affected by the superimposed graphical representation, and by specifying at least one of the center of the area, the area form (e.g., a circle, square, rectangle, triangle, diamond, and so on) and the size or radius of the area form.

In an example, the indication may consist of a bit, i.e., 0 or 1, indicating the presence of the graphical representation or not, and if there is a superimposed graphical representation, the indication may additionally consist of the form of the graphical representation, e.g., 0 for a circle and 1 for a square, and of the (scaled) radius r of the graphical representation that is encoded in a few bits, e.g., 3 bits. The radius may, e.g., be scaled by a fixed value depending on the QR code version For example, a radius of value r may be multiplied by a scaling factor F so that the actual radius of the graphical representation in pixels is r*F. This example embodiment has multiple benefits, one of them being that larger graphical representation can be superimposed on QR codes.

It should be noted that if the header indicates the presence of a graphical representation, then the data pixels in the indicated physical area of the first QR code will store no data. Thus, the first QR code will not use these data pixels to store any data and, when the first QR code is scanned by a QR code reader, these data pixels will be ignored by the QR code reader. Therefore, this impacts the amount of encoded data which can be stored in the first QR code, but this also speeds up the reading process for the QR code reader. Based on the example of FIG. 3, FIG. 5 shows how the data pixels are alternately allocated to the application data of the applications A and B in presence of a picture. It should be noted that this technique is also applicable to QR codes storing a single application. As can be seen, FIG. 5 indicates the presence of a picture whose area coincides with the area occupied by 25 data pixels in the middle of the first QR code, wherein the center of the picture is indicated by the group of letters "CI" and other data pixels whose area is occupied by the picture are indicated by the letter "I". It can be seen that the presence of the picture does not change the initial allocation of the data pixels whose area does not coincide with the area of the picture, even if this can lead to two "consecutive" data pixels with the picture in-between that are assigned to the application data of the same application A or B.

As aforementioned, an example method using the ECM and optionally the EDM in each data container has been described to encode, into the encoded data, the information of the plurality of applications for storage in the first QR code.

Figure 6:
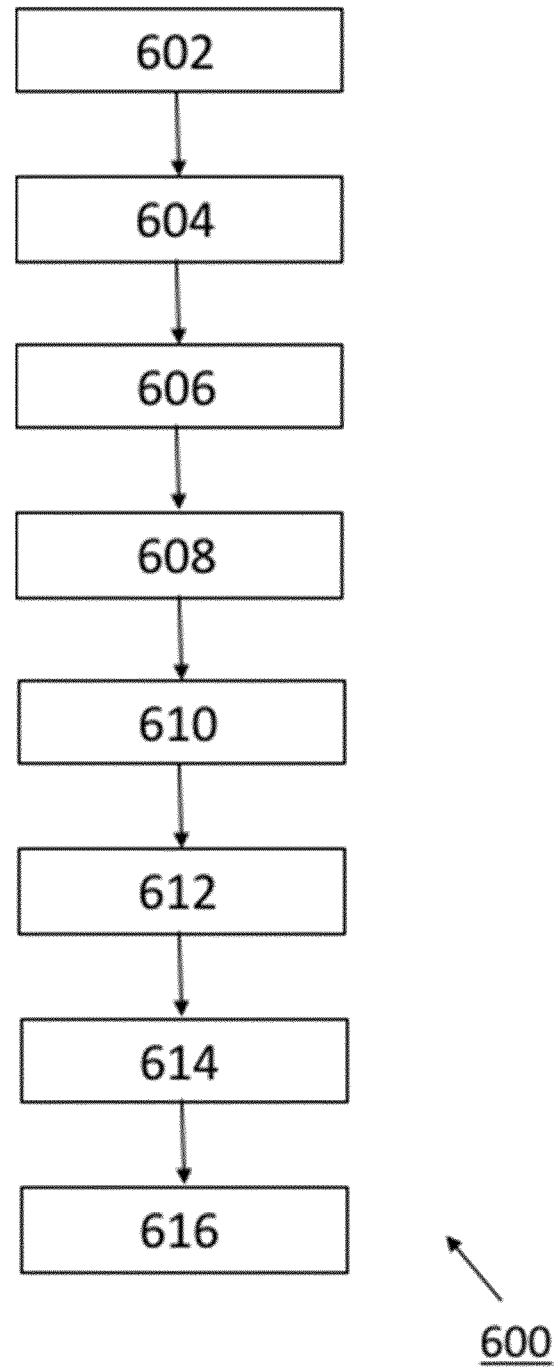
FIG. 6 shows a schematic flowchart describing an example decoding procedure according to an embodiment of the present invention.

In an example embodiment of the present invention, a QR code reader can scan and selectively read these encoded data for each application that are stored in the first QR code (i.e., the master QR code). This can be achieved through an example method 600 of decoding information of a respective application amongst a plurality of applications, wherein the information is stored as the encoded data in the first QR code and the encoded data include at least a header and a respective data container per application. The example method 600 as schematically described in FIG. 6 can comprise at least the following steps:

at step 602, reading the header of the first QR code, the header including a single identifier indicating a presence of a plurality of applications, and a count of the plurality of applications and a respective application identifier per application;

at step 604, identifying, from the header, the first QR code by using the single identifier indicating the presence of the plurality of applications;

at step 606, identifying, from the header, the respective application. For example, the QR code reader may store a preconfigured application identifier corresponding to the respective application identifier;

at step 608, identifying the respective data container associated with the respective application, e.g., based on a position in which the respective application identifier appears on a display of the QR code reader;

at step 610, reading all those pixels associated with the data container of the respective application to retrieve at least one data codeword (e.g., of 8-bit length) associated with the respective application and the parity bits (PB), error detection information (EDM) bits, or error correction information (ECM) bits for the respective application. The QR code reader can use the EDM or ECM linked to the read at least one data codeword (e.g., of 8-bit length) associated with the respective application to detect or correct any error;

at step 612, obtain the error-free application data D (e.g., Di) of the respective application (e.g., OAi);

at step 614, if the ECM/EDM also have capabilities to detect whether all errors have been corrected, then detecting, using the ECM/EDM, whether there are any error present in the retrieved application data D of the respective application. This can be done if D includes a CRC or if the ECM can detect errors as Reed-Solomon codes do; and at step 616, if any error is detected, then reading, by the QR code reader, the whole application data of all data containers. The QR code reader can then retrieve the parity bits (PB), error detection information (EDM) bits, or error correction information (ECM) bits for the remaining applications (i.e., the parity bits from the other data containers) and use these bits as well as the application data in all the data containers to attempt to correct the still present errors in the respective application of interest.

It should be noted that, after the step of reading the header data (HD), the QR code reader may also apply ECM/EDM to the header only if the header has its own error detection/correction capabilities.

It should be noted that, at the step of reading all those pixels associated with the data container of the respective application and at the step of detecting, using the ECM/EDM, whether there are any error present in the retrieved application data D of the respective application, the QR code reader may also apply ECM/EDM to the header if the error detection/correction capabilities are applied not only to the respective application, but to the concatenation of the header and the application data.

It should be noted that, at the step of reading the header data (HD), the QR code reader may read multiple copies of the header (provided multiple copies of the header are available in the first QR code) to ensure that the header data (HD) are properly read.

In another example embodiment of the present invention, a QR code reader can scan and selectively read these encoded data for each application that are stored in the first QR code (i.e., the master QR code). This can be achieved through an example method 700 of decoding information of a respective application amongst a plurality of applications, wherein the information is stored as the encoded data in the first QR code and the encoded data include at least a header and a respective data container per application. The example method 700 as schematically described in FIG. 7 can comprise at least the following steps:

- at step 702, identifying (e.g., from some header data information such as a single identifier) the first QR code as being a master QR code, i.e., a QR code handling a plurality of applications (e.g., two applications related to Easy Connect and an SHS);
- at step 704, reading the symbols in the QR code and extracting a bitstring from the QR code after error correction where the bitstring contains data related to a plurality of applications; and at step 706, locating a part of the bitstring, also designated as a sub-bitstring (i.e., a data container), related to a first application from the extracted bitstring where the location of the sub-bitstring (i.e., the data container) is determined from the header data or a preconfigured policy or context (e.g., if the two applications Easy Connect and the SHS use different semantics, then they might just agree on a part of the bitstring being for Easy Connect and the remaining part being for the SHS).

Figure 7:
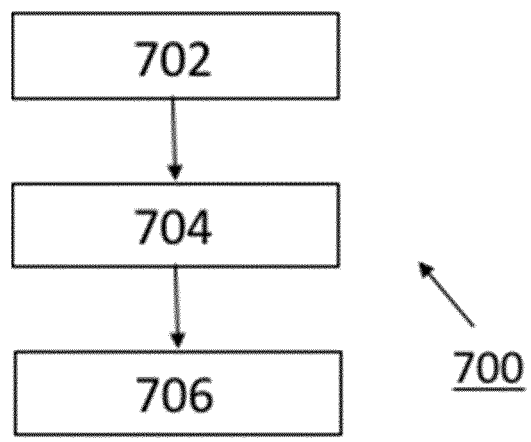
FIG. 7 shows a schematic flowchart describing another example decoding procedure according to an embodiment of the present invention.

This implementation of FIG. 7 has the benefit to require few changes with respect to the QR code standard.

In another example embodiment of the present invention, a QR code reader can scan and selectively read these encoded data for each application that are stored in the first QR code (i.e., the master QR code). This can be achieved through an example method 800 of decoding information of a respective application amongst a plurality of applications, wherein the information is stored as the encoded data in the first QR code and the encoded data include at least a header and a respective data container per application. The example method 800 as schematically described in FIG. 8 can comprise at least the following steps:

- at step 802, extracting a string (e.g., a sequence of characters following a given encoding);
- at step 804, checking whether the QR code contains a plurality of applications (i.e., two or more applications) by looking at the header (e.g., the single identifier) in the string, e.g., the first N characters in the string;
- at step 806, if the header matches, accessing a substring containing the information of the respective application.

Figure 8:
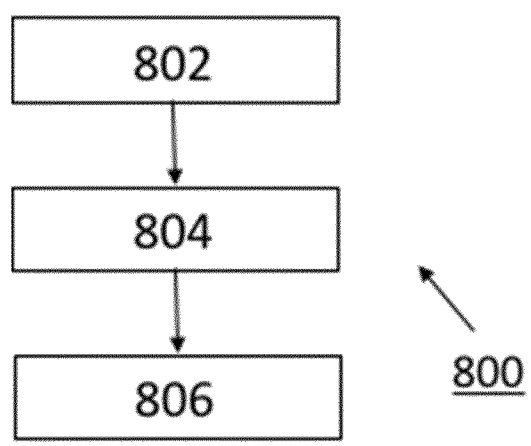
FIG. 8 shows a schematic flowchart describing another example decoding procedure according to an embodiment of the present invention.

This implementation of FIG. 8 has the benefit to require no change with respect to the QR code standard.

To identify the first QR code as being a master QR code, i.e., a QR code handling a plurality of applications, in an example, the person handling the QR code reader may visually identify the master QR code, e.g., by means of a user-understandable printed pattern (e.g., the letter M) superimposed on the master QR code. In another example, if the person handling the QR code reader does not know which QR code amongst a plurality of QR codes is the right master QR code and hence points the QR code reader towards the plurality of these QR codes such that they are simultaneously captured, then the QR code reader may identify all these QR codes, determine the presence of a master QR code, e.g., by monitoring a distinctive feature (e.g., a few pixels) indicating that it is a master QR code or by reading the header data to identify the single identifier indicating the presence of a plurality of applications.

In an embodiment where the plurality of QR codes is read simultaneously, the headers of respective containers may contain indications of the order in which the containers are intended to be used.

Figure 9:
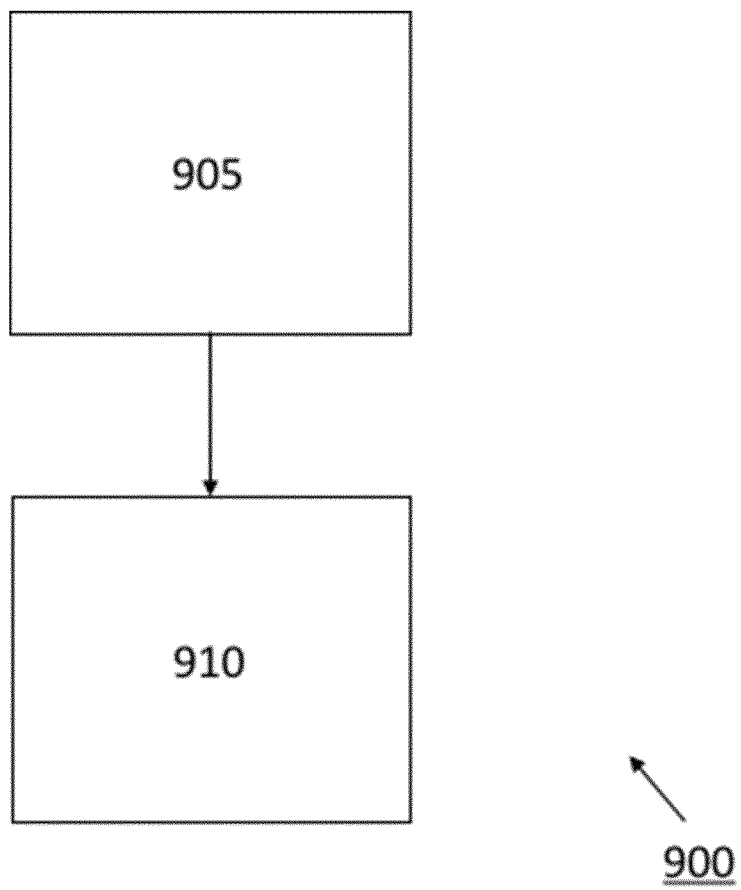
FIG. 9 shows a schematic block diagram of a device capable of encoding information of multiple applications and creating a QR code, according to an embodiment of the present invention.

FIG. 9 shows a schematic block diagram 900 of a device 905 capable of encoding information of multiple applications and creating a QR code 910, according to an embodiment of the present invention. The device 905 may be a computing device, e.g., a computer, which takes as input information from a plurality of applications, and then encodes the information of the plurality of applications as described in the aforementioned embodiments referring to FIG. 2, to create a first QR code 910, i.e., a QR code capable of handling multiple applications.

Figure 10:
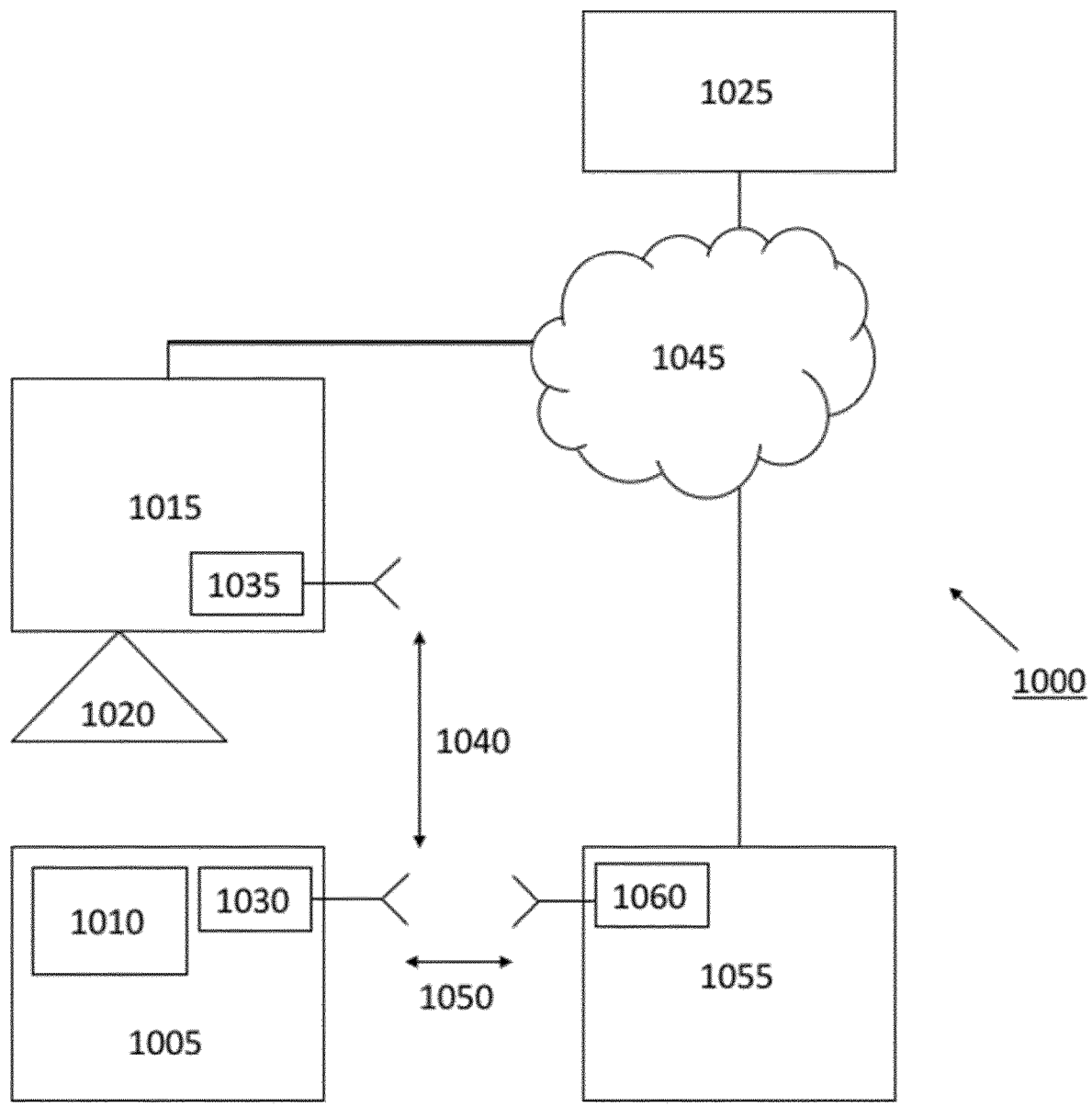
FIG. 10 shows a schematic system for commissioning according to an embodiment of the present invention.

FIG. 10 shows a schematic system 1000 for commissioning according to an embodiment of the present invention. The system 1000 comprises at least a first device 1005 with which a first QR code 1010 is associated, and a QR code reader 1015 equipped with a camera 1020. A second device 1025, and/or a third device 1055 may also be present. The QR code 1010 may be associated with the first device 1005 by various methods such as physically attaching the QR code 1010 to the first device 1005 and/or printing the QR code 1010 on the first device 1005 or on packaging in which the first device 1005 comes or any other way.

The first device 1005 with which the first QR code 1010 is associated comprises a first communication interface 1030. The camera 1020 of the QR code reader 1015 is used to scan and read the first QR code 1010. Upon decoding the first QR code 1010, the QR code reader 1015 takes a decision on the chosen application from the first QR code 1010, e.g., based on a local policy or context, and on the commissioning protocol to execute with the first device 1005. In a first alternative, the QR code reader 1015 includes a second communication interface 1035 which is used to start and execute a first commissioning protocol 1040 with the first device 1005, and which possibly interfaces with the third device 1055, i.e., an additional networking device 1055, which may e.g. be a Wi-Fi Access Point (AP) or a gateway device, through a dedicated communication network 1045, or directly in between communication interfaces 1035 and 1060. Dedicated communication network 1045 may e.g. be a local area network (LAN) like ethernet, Wi-Fi, Zigbee, etc., or a wide area network (WAN) like a cellular network or the Internet or any combination of networks. The first protocol may be a protocol to set-up (secure) communication between first device 1005 and the additional networking device 1055. In a second alternative, the QR code reader 1015 triggers a second commissioning protocol 1050, either identical to or different from the first commissioning protocol, between the first device 1005 and second device 1025, where the latter may e.g. be a server of a cloud service, or an "Administrator" device, through the third device 1055, i.e., an additional networking device 1055, including a third communication interface 1060, and communication network 1045.

A third alternative may be sort of a combination of the previous two alternatives, where QR code reader 1015, based on information in first QR code 1010, triggers the first commissioning protocol so set up the (secure) communication between first device 1005 and third device 1055, which may e.g. be a Wi-Fi AP or a gateway device, and triggers the second commissioning protocol, either identical to or different from the first commissioning protocol, to set up the (secure) communication through third device 1055 and network 1045 between first device 1005 and second device 1025, where the latter may, e.g., be a server of a cloud service, or an "Administrator" device.

Figure 11:
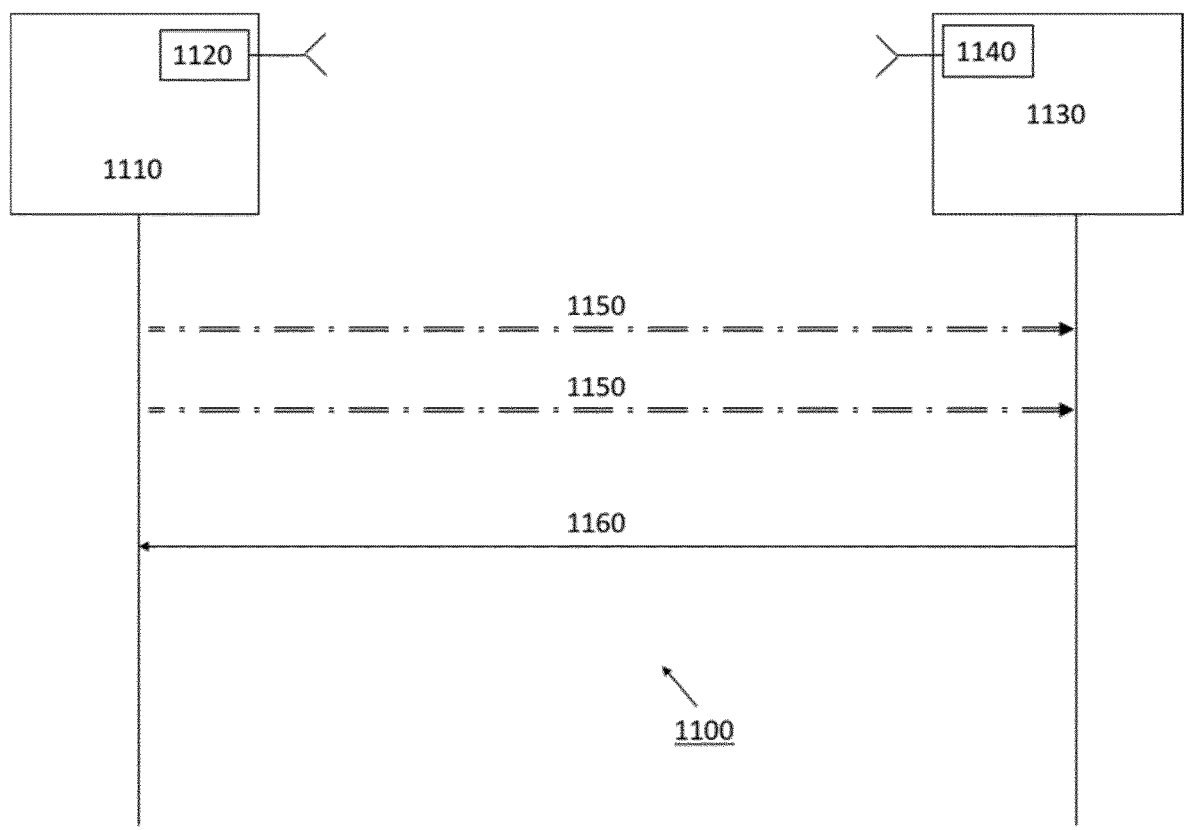
FIG. 11 shows a commissioning protocol according to a conventional embodiment.

FIG. 11 shows a commissioning protocol 1100 according to a conventional embodiment, between a first device 1110 comprising a first communication interface 1120 and a second device 1130 comprising a second communication interface 1140. The first device 1110 may announce its presence by means of commissioning messages 1150 related to the commissioning protocol 1100. The second device 1130 starts the commissioning flow of the commissioning protocol 1100 by returning a message 1160.

Figure 12:
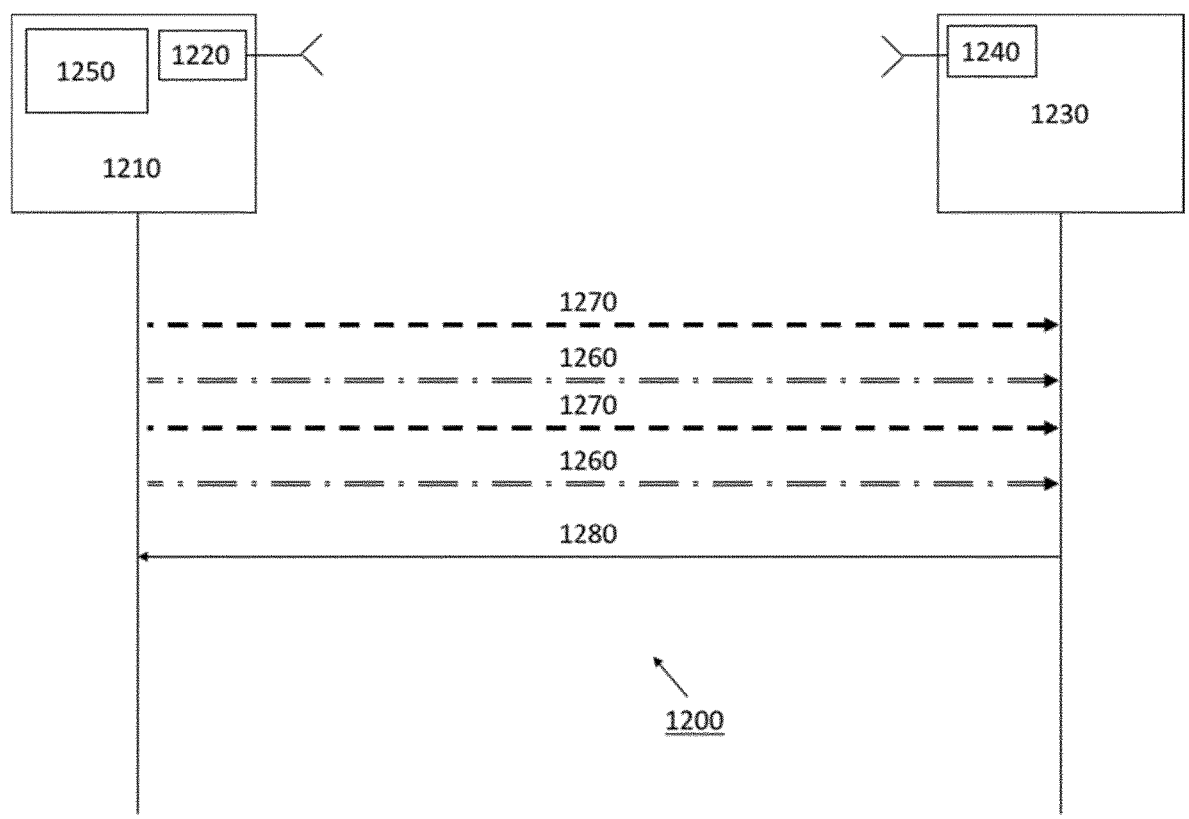
FIG. 12 shows a commissioning protocol according to an embodiment of the present invention.

FIG. 12 shows a commissioning protocol 1200 according to an embodiment of the present invention, between a first device 1210 comprising a first communication interface 1220 and a second device 1230 comprising a second communication interface 1240. Unlike the first device 1110 of FIG. 11, the first device 1210 of FIG. 12 is provided with an attached first QR code 1250. This first QR code 1250 contains commissioning information for different two commissioning protocols which may run over the same (first) communication interface 1220 of the first device 1210. The first device 1210 may announce its presence as well as its commissioning capabilities by means of commissioning messages 1260 and 1270 related to a respective commissioning protocol amongst the two commissioning protocols. After decoding the first QR code 1250 attached to the first device 1210, the second device 1230 starts a chosen commissioning protocol amongst the two commissioning protocols by returning a message 1280.

In a device-controlled configuration method like Device Provisioning Protocol (DPP) which is used in networks using Wi-Fi or IEEE 802.11, a device acting as a DPP configurator can securely configure any Wi-Fi enabled device acting as enrollee for connecting to, e.g., a Wi-Fi Access Point (AP). In the present invention, the first QR code is a master QR code capable of storing the information of a plurality of applications. In an example embodiment, a respective Wi-Fi connection can be established between a plurality of configurators and the first Wi-Fi enabled device acting as an enrollee and to which a first QR code is attached. Thereby, the first QR code can contain DPP bootstrapping information, e.g., a public key in an encoded form, of the first Wi-Fi enabled device, each configurator scanning the first QR code of the first Wi-Fi enabled device during the boostrapping process to retrieve its respective public key.

In DPP, the process starts with the two devices 1210, 1230 in an unconnected state and one of the devices is unconfigured for connecting to the Wi-Fi network in question. One device 1230 is used to configure the other device 1210 for joining the wireless network i.e. connecting to the network access point (AP) and may be referred to as the Configurator (or commissioner) and the second device as the Enrollee (or commissionee).

A first phase is 'bootstrapping', whereby one device obtains the obtains the bootstrapping public key (BR) of another device and, for the device to be configured. This is by another means than the wireless communication technology and so is commonly called 'out-of-band' communication (OOB), here the user causing one device to read a QR code on the second device. If the bootstrapping has been successful, the devices are 'bootstrapped', otherwise they revert to the 'start' state. Frequently, simple or so-called headless devices (i.e. those with little or no user-interface), are programmed to wake up after power-on or after a reset and turn on their radio on the channel indicated in their QR-code for configuration and start listening for an authentication request message. (A non-simple device, e.g. a smart phone or a laptop, would be set in this mode through its user interface if the user wants it to be configured) The devices perform an authentication procedure whereby the devices establish 'trust' i.e. the user is able to be confident that the devices are what they believe them to be and not other, unknown (and potentially malicious), devices 'pretending' to be one or other of the devices in question. A message is sent from one device requesting to start an authentication. This message can be sent by either the device doing the configuring (Configurator) or the device to be configured, the Enrollee. The Configurator/commissioner may be connected to the Wi-Fi network though this is not necessarily required for the embodiments to work. The device starting the wireless communication is called the Initiator and the device responding is called the Responder. The DPP protocol, in particular, allows both a Configurator and an Enrollee device to act as the Initiator of the DPP protocol, whereby the other device automatically becomes the Responder. Simple devices or headless device usually will assume the Responder role.

The other device responds to this message. If the authentication request message is decoded correctly and contains the information indicating that the Initiator is the device the user believes it to be and has the required capabilities, the response message indicates that the message has been 'accepted' and contains information needed by the Initiator to verify the credentials of the Responder and that it too has the required capabilities. If the two devices do not receive from the other device the required information, the process aborts and the device return to the bootstrapped state.

In the case of the DPP protocol, the first message is the Authentication Request message and the response message is the DPP Authentication Response. The Responder checks the DPP Authentication Request message contains a correctly generated cryptographic hash of the Responder public bootstrapping key and optionally whether it has a copy of the Initiator's public bootstrapping key. The responder sends a DPP Authentication Respond message indicating whether the authentication can continue. If not, because for example the attempt to decrypt an encrypted nonce in the DPP Authentication Request message fails, the process is aborted. The DPP Authentication Response contains a cryptographic hash of the Responders public bootstrapping key and may contain the hash of the Initiator public bootstrapping key. Likewise, for the Initiator, the Enrollee may have obtained this public key by an OOB communication. The public bootstrapping key of the Initiator may then be used for mutual authentication. Without the public bootstrapping key of the Initiator, only the Initiator can authenticate the Enrollee, but not the other way around.

If the authentication response message indicates that the Responder has accepted the authentication request message and the response meets the criteria imposed by the set-up of the Initiator, the Initiator issues an authentication confirmation message. If the authentication values in the authentication response and the confirmation message are found to be correct by the relevant devices, this part of the protocol, the authentication part, is successful, the configuration can start. The confirmation message may also contain an indication of the result of a previous configuration attempt where the Enrollee is also the Initiator.

In the case of the DPP protocol, the authentication confirmation message is the DPP Authentication Confirm message.

Then Enrollee device sends a configuration request message with information on what type of configuration the Enrollee wants. If the Configurator is able to grant the request, it sends a message with the information needed by the Enrollee such as a network key. The process then concludes with a successful configuration of the Enrollee.

In the case of DPP, the request message is the DPP Configuration Request and the Configurators response is the DPP Configuration Response message. The DPP Configuration Response may contain the service set identifier (SSID) of the network the Enrollee should connect to and may contain a DPP Connector. The DPP Connector can be viewed as a certificate, digitally signed by the Configurator, and contains among other things the public network access key of the Enrollee. The DPP Configuration Response message also contains the public signing key of the Configurator. Other devices that have been configured by the same Configurator can thereby check whether they can trust the public network access key of other devices. The DPP Configuration Response message may also contain the Wi-Fi passphrase or Pre Shared Key (PSK) of the network. The Enrollee sends a DPP Configuration Result message (depending on the version of DPP) to the Configurator to let it know whether it accepts the configuration or not. Not receiving this message by the Configurator may indicate to the Configurator that there was a Wi-Fi problem between the Configurator and the Enrollee. Then the 'supposedly configured' Enrollee can send its Connector to a DPP configured AP. If the Connectors signature is found correct and if the AP has a matching Connector, i.e. a Connector for the same network, signed by the same Configurator, the AP sends its own Connector to the Enrollee. The Enrollee and the AP can compute a symmetric key based on each other's network access key in the Connectors and their own private network access key in Diffie-Hellman fashion.

In case the Enrollee received a Wi-Fi password or Wi-Fi Pre Shared key (PSK), the Enrollee tries to associate with the AP in the normal way through the 4-way handshake as specified in the IEEE 802.11 standard. A protocol for configuring or commissioning a device for joining an SHS network may involve an exchange of keys wherein a code is provided to the commissioning device. This code, which acts as a password, is provided by an out-of-band method. In the present example, this passcode may be incorporated into the part of the enrollee device's QR code relating to the SHS commissioning application.

In an example case of the present invention, a device, e.g., a wireless device or a Wi-Fi wireless device, may be able to join a Wi-Fi network by means of DPP or an SHS network by means of the SHS bootstrapping protocol. In this case, the device may have a first QR code as defined in the present invention, that is capable of storing information related to DPP and the SHS bootstrapping protocol. In an example embodiment, a configurator or commissioner implements (or communicates with) a QR code reader that reads the first QR code attached to a device triggering a DPP or an SHS bootstrapping protocol based on at least one of: (1) a preconfiguration in the QR code reader, (2) a policy available in the QR code reader, and (3) the contextual requirements available in the environment in which the device is being deployed. Thus, the steps required for this example embodiment may comprise:

a) reading the first QR code;
b) determining the supported applications from the read first QR code, in particular, the supported commissioning protocols;
c) choosing an application (e.g., a preferred application) based on at least one of: (1) a preconfigured choice, (2) a policy, (3) a context, and (4) a preference included in the first QR code. For example, the QR code reader may be a QR code reader for DPP-based commissioning and be only able to execute DPP. For example, the policy may prefer the usage of an application if available and use it if supported (indicated by means of the first QR code). For example, the QR code reader may detect whether the context or environment (e.g., a home, or a hospital) where the device is to be deployed only supports a given application (e.g., only a highly secure DPP-based Wi-Fi configuration process), and may then make an application choice based on this. The detection may be based, e.g., on the presence or content of beacons transmitted by the devices. For example, a first QR code may include a field that indicates the preferred application choice to the QR code reader depending on the context; and
d) starting the chosen application (e.g., the chosen preferred application) as a first chosen application. In the case of a commissioning application, the configurator or commissioner should not start a second chosen application as long as the first chosen application has not succeeded or has failed, e.g., as long as the commissioning process associated with the first chosen application has not succeeded or has failed, a minimum number N of times, e.g., N=1, 2, . . . .

In an example embodiment of the present invention, a first QR code (potentially attached to a product or device) as defined in the present invention may contain information related to two or more applications. A QR code reader reading it may execute both applications based on a preconfiguration, a policy, or a context. The execution of both applications may be sequential, e.g., in an order defined by a policy. The execution of one of the applications may also be partial (e.g., in the case where a second commissioning protocol relies on a first commissioning protocol (DPP) as an intermediate step). The applications or different stages of the applications may be also executed multiple times. As a further example, if the first QR code is attached to a device, e.g., a wireless device or a Wi-Fi wireless device, the device may be able to join a smart home system (SHS) by relying on commissioning protocols of (1) the underlying wireless networking technology, e.g., Wi-Fi, and (2) the SHS. In this case, the device may have the first QR code, as defined in the present invention, that is capable of storing information related to wireless networking technology and bootstrapping protocol of the SHS. In an example embodiment, a configurator or commissioner implements (or communicates with) a QR code reader that reads the first QR code attached to a device triggering a DPP bootstrapping protocol and a SHS bootstrapping protocol based on at least one of: (1) a preconfiguration in the QR code reader, (2) a policy available in the QR code reader, and (3) contextual requirements available in the environment in which the device is being deployed. Thus, the steps required for this example embodiment may comprise:

a) reading the first QR code;
b) determining the supported applications from the read first QR code, in particular, the supported commissioning protocols;
c) choosing an application execution order (e.g., a preferred application execution order) based on at least one of: (1) a preconfigured choice, (2) a policy, (3) a context, and (4) a preference included in the first QR code. For example, the QR code reader may be a QR code reader for the SHS capable of interoperability with DPP-based Wi-Fi networks. For example, the QR code reader may detect whether the context or environment (e.g., a home, or a hospital) where the device is to be deployed requires both applications (e.g., secure DPP-based Wi-Fi configuration process and SHS configuration process), and may then make an application choice based on this;

d) starting a first application. In the case of a commissioning application, the configurator or commissioner should not start a second chosen application as long as the first chosen application has not succeeded or has failed, at least, until a preconfigured target step, e.g., as long as the commissioning process associated with the first chosen application has not succeeded or has failed, a minimum number N of times, e.g., N=1, 2, . . . ;

e) upon successful (possibly partial in the case where a second commissioning protocol may rely on a first commissioning protocol (DPP) as a intermediate step) execution of the first application, starting a second application, e.g., in the case of a commissioning protocol, a second commissioning protocol providing a further configuration to the device to attach it to the network; and f) optionally, upon (un)successful execution of step e) and the second application, returning to the first application to finish it.

Figure 13:
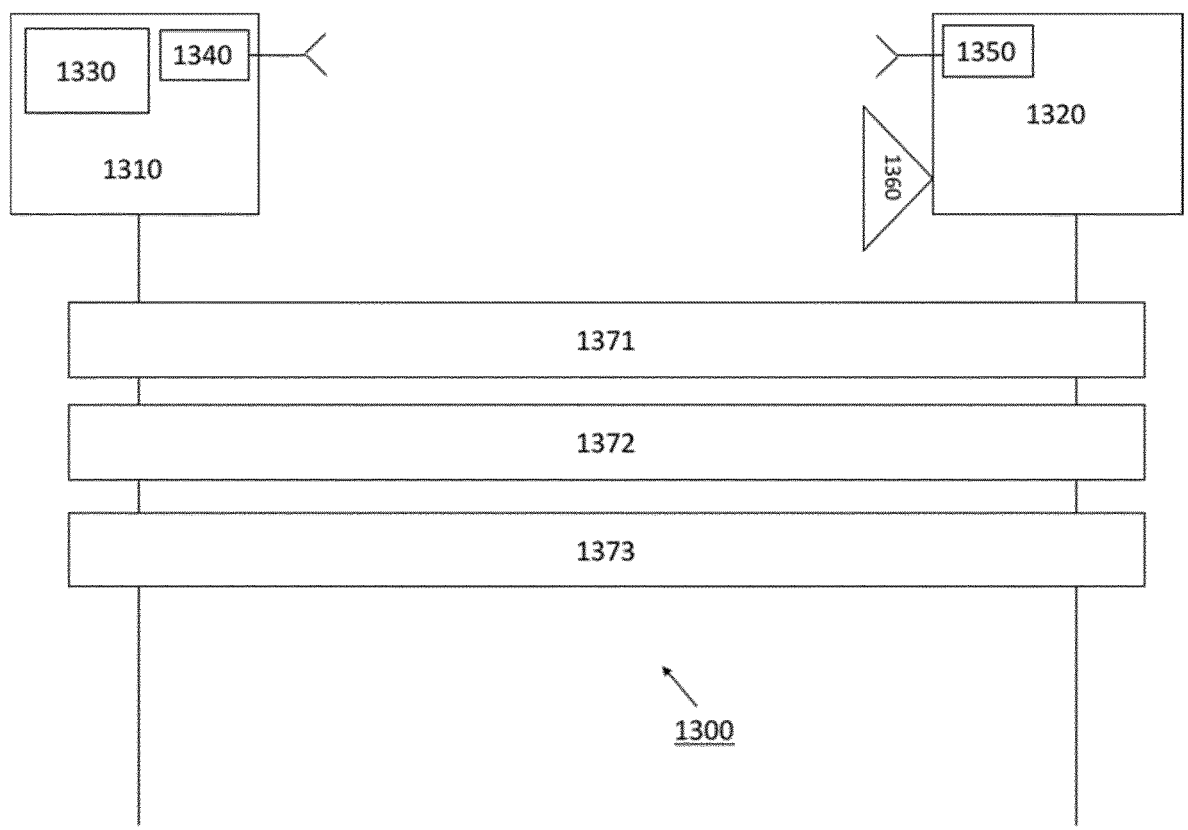
FIG. 13 shows a commissioning protocol according to an embodiment of the present invention.

This example embodiment is illustrated by means of FIG. 13 showing a commissioning protocol 1300 between a first device 1310 comprising an attached first QR code 1330 and a first communication interface 1340, and a second device 1320 comprising a second communication interface 1350 and a camera 1360 for QR code scanning. The second device 1320 scans the first QR code 1330 and based on, e.g., a policy, decides to execute over the communication interfaces 1350 and 1340 with the first device 1310, the commissioning steps 1371, 1372, 1373 belonging to first and second applications available in the first QR code 1330. In an example scenario, step 1371 may refer to a first commissioning protocol, step 1372 may refer to a second commissioning protocol when step 1371 reaches a certain stage, and step 1373 may refer again to a first commissioning protocol upon (un)successful execution of step 1372 continuing the execution of step 1371.

In the present invention, if a device, e.g., a Wi-Fi product, has an attached first QR code containing, e.g., two applications such as a DPP application and an SHS application, then the commissioning device may also choose to use Wi-Fi Easy Connect for Wi-Fi commissioning, and the SHS protocol for connecting the device, to which the first QR code is attached, to the cloud services and all the other higher-level services.

In the present invention, if a device, e.g., a Wi-Fi product, has an attached first QR code containing, e.g., two applications such as a DPP application and an SHS application, then the device, to which the first QR code is attached, may need to react to the request from the configurator (e.g., DPP) or commissioner (e.g., Matter) upon reading of the first QR code. Once the device receives a first request for a first application identified in the first QR code, the device should not accept any subsequent request for a second application included in the first QR code as long as the first application has not concluded.

In the present invention, if a device supports a given application, then the first QR code attached to the device and including information about the application may indicate whether that information is broadcasted (in the clear or not) or not. For example, some fields may not be broadcasted (a 0 bitstring is broadcasted instead) due to privacy reasons, however, this may hamper the commissioner (triggered by the first QR reader) from choosing a commissioning message from the right device, e.g., a message containing the service set identifier (SSID) of the right device, when the device enters a given configuration state, e.g., by becoming a soft access point (softAP). Alternatively, the first QR code may include a random bitmask, e.g., a random bitmask unique per device, that is used to XOR (encrypt) some of the fields included in the first QR code before being broadcasted, e.g., when included in a beacon or as part of the SSID of the device. A device reading this information, e.g., a random bitmask, from the QR code knows then how to decrypt the information contained in the received wireless beacons from the device.

To summarize, the present invention relates to a multiple application QR code, denoted by a first or master QR code, capable of storing the information of a plurality of applications in such a way that a respective information can be retrieved for each application in a reliable and time-efficient manner. The information is encoded into encoded data including at least a header (e.g., a single identifier) and a respective data container (e.g., a part of a bitstring or sub-bitstring in a complete bitstring) per application. The header can comprise at least a single identifier indicating a presence of the plurality of applications and a respective application identifier per application. A respective error correction mechanism may be included in each data container per application. The encoded data are distributedly stored in a plurality of data pixels distributed over an encoding region of the first/master QR code, according to an allocation rule. A QR code reader may retrieve the information stored in the QR code by only accessing and processing the data pixels associated with the respective application of interest and by using an error correction which is specific to this respective application.

While the invention has been illustrated and described in detail in the drawings and foregoing description, such illustration and description are to be considered illustrative or exemplary and not restrictive. Moreover, the invention can be applied in any product that implements a network interface (e.g., Wi-Fi, Bluetooth Low Energy, or other type) or commissioning protocol (e.g., Wi-Fi Easy Connect or a smart home system such Matter). The QR code reader might directly communicate with the product by using the same network interface implemented by the product, or indirectly, e.g., through an Access Point (AP) or Gateway.

In a similar manner, a system 1400 for reading and processing with a single scanning of a QR code according to an embodiment of the present invention may include a personal data app (such as one used on a mobile phone) to be used by a user to request, store and display personal data associated with a single person or multiple persons. An example of such data could be reports relating to vaccination, infection testing or certificates indicating recovery from a particular infection.

Figure 14:
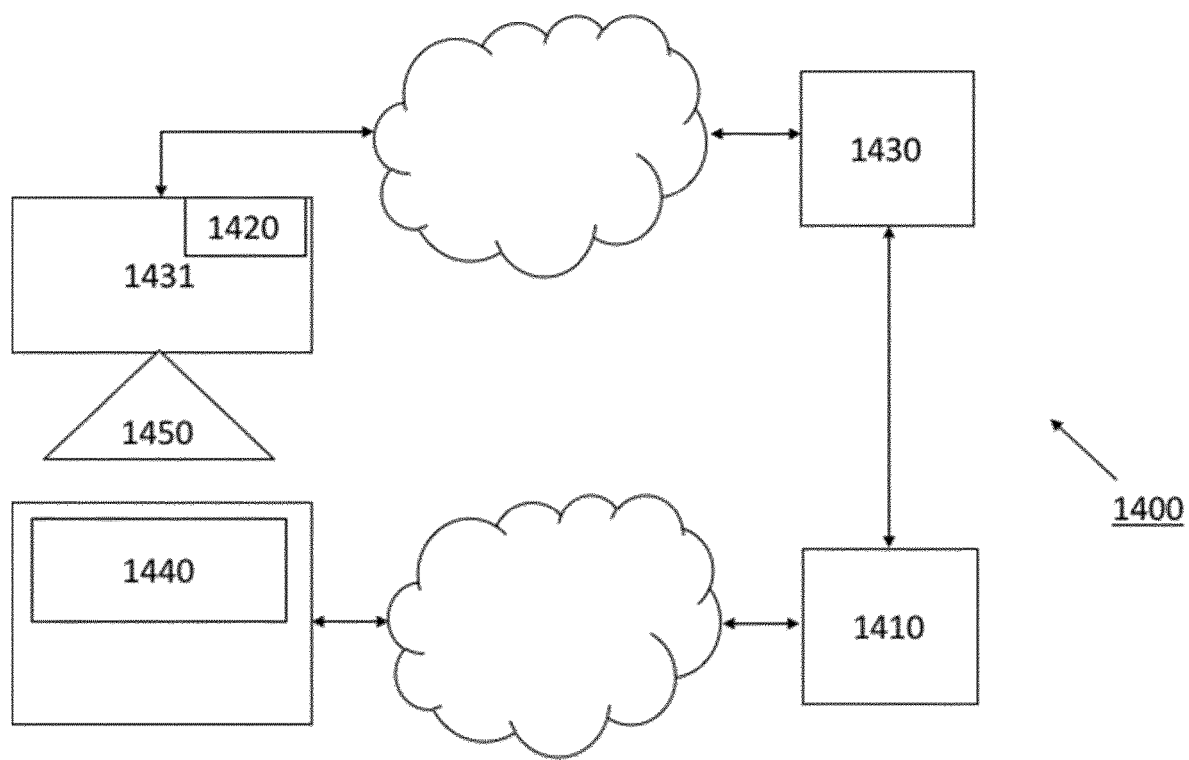
FIG. 14 shows a system for reading and processing with a single scanning of a QR code according to an embodiment of the present invention.

FIG. 14 shows the system 1400 including at least a personal report encoded by means of a QR code 1410 displayed by means of a personal data app (1431) running on a mobile a QR code reading device 1420 (such as a mobile phone). The QR code 1410 can be scanned by means of the QR code reader 1420 with a camera 1430. A first managing entity 1440 in charge of delivering personal reports, e.g., reports related to the person status regarding a disease, upon identification/authentication of a person given some identification credentials. This managing entity might also manage some secret keying material, e.g., a private key, to sign the personal reports. Optionally, a second managing entity 1450 in charge of verifying the personal reports, e.g, by checking the digital signature on the personal report or by checking the multiple reports against a policy. The second managing entity 1450 and the personal data app 1431 interact to deliver the personal reports from the first managing entity 1440 to the personal data app 1431. The personal data app 1431 might be implemented as part of the second managing entity 1450 in the QR code reader 1420 or the QR code reader 1420 might forward the retrieved personal reports to the managing entity 1450 for verification.

The personal data associated with a single person or multiple persons may be encoded by means of a multiple application QR code and stored in the mobile app.

Where the personal data concerns data of an official nature such the aforementioned vaccination/recovery/test reports, a managing entity may be entrusted with the task of creating the personal data records for the person(s) in question upon identification/authentication of the person(s) using some identification i.e. corresponding to the first managing entity 1440. This managing entity 1440 might also manage some secret keying material, e.g., a private key, to sign the personal data reports. In such a case, there may be a second managing entity (i.e., the above-mentioned second managing entity 1450) in charge of verifying the personal data reports, e.g, by checking the digital signature on the report or by checking the multiple reports against a policy.

Personnel acting for the second management entity 1450 may use a QR code reader 1420 (e.g., running as a mobile app used to read the personal data reports 1410 and implement policies based on the results of the reading of the personal data reports. Such policies may include, without any limitation, official policies such as restrictions on access or passage.

A QR code containing personal data report associated to a single person might include an overall signature allowing the QR code reader (or the verification entity retrieving and verifying the data read from the QR code by means of the QR code reader) to check that all the personal data reports are linked together.

To achieve this, each personal data report needs to be included in a different data container as described above. Furthermore, an overall signature is included, e.g., in a last data container or as part of the header.

A QR code including personal data reports associated with multiple persons might include an overall signature allowing the QR code reader (or the personal data verification entity retrieving and verifying the data read from the QR code by means of the QR code reader) to check that all the personal data reports are linked together.

To achieve this, multiple users might identify/authenticate themselves through the same personal data app, e.g., by using their official credentials. Every time a user identifies/authenticates himself through the same app, a new QR code is created that includes the Personal data reports for all users identified/authenticated so far in that personal data app. Each Personal data report is included in a different data container. An overall signature generated by the certification authority in charge of certifying the Covid 19 (vaccination/recovery/test) reports is appended and included, e.g., in a last data container, that allows verifying that all the personal data reports in the QR code can be read together, e.g., belong to group of persons that live together.

If a QR code includes personal data reports for the domestic or International trips, the QR code reader might automatically select the preferred application based on context, e.g., based on the location. The QR code might include the home country, e.g., in the header. Then the QR code reader might select a specific data container (i.e., personal data report for use in a specific region) based on the location of the QR code reader.

Where a QR code includes multiple personal data reports linked to regular vaccination shots, the QR code reader might only accept the Personal data reports if they are fresh (issued within a given time period) and the Personal data report fulfils a policy deployed by the second managing entity.

An example of such a policy might state, e.g., that the most vaccination has been given in the last X months (e.g., in the last 3 months) or that no person in the (family) group should be allowed if one of the members does not have a positive recovery report.

Where a QR code includes personal data reports associated to multiple persons, e.g., family members, it is expected that those family members will validate their identities together by showing their IDs using a single QR code. Thus, a multiple application QR code including personal data reports associated to multiple persons might only be accepted by the QR code reader based on a complex policy, e.g.:

A multiple application QR code may then only accepted by the QR code reader if at least 2 persons are present with valid IDs The processing of personal data of groups in a group manner presents notable advantages. Firstly, there is a significant saving in time and trouble where the second managing entity personal are reading and checking the personal data reports. Those personnel are often under pressure to process the people quickly and often the physical disposition of the space makes can make this awkward. With a single read and check operation, a whole group may be checked and authorized (or not) to proceed—which is much faster and less error-prone than having to process each QR code individually. Furthermore, the process according to this embodiment makes it more difficult to misuse the personal data reports, in that there is a second-level of certification present: there is certification of the individual containers and certification of the overall QR code.

Other variations to the disclosed embodiments can be understood and effected by those skilled in the art in practicing the claimed invention, from a study of the drawings, the disclosure and the appended claims. In the claims, the word "comprising" does not exclude other elements or steps, and the indefinite article "a" or "an" does not exclude a plurality. A single processor or other unit may fulfil the functions of several items recited in the claims. The mere fact that certain measures are recited in mutually different dependent claims does not indicate that a combination of these measures cannot be used to advantage.

The foregoing description details certain embodiments of the invention. It will be appreciated, however, that no matter how detailed the foregoing appears in the text, the invention may be practiced in many ways, and is therefore not limited to the embodiments disclosed. It should be noted that the use of particular terminology when describing certain features or aspects of the invention should not be taken to imply that the terminology is being re-defined herein to be restricted to include any specific characteristics of the features or aspects of the invention with which that terminology is associated.

A single unit or device may fulfill the functions of several items recited in the claims. The mere fact that certain measures are recited in mutually different dependent claims does not indicate that a combination of these measures cannot be used to advantage.

The described operations can be implemented as program code means of a computer program and/or as dedicated hardware. The computer program may be stored and/or distributed on a suitable medium, such as an optical storage medium or a solid-state medium, supplied together with or as part of other hardware, but may also be distributed in other forms, such as via the Internet or other wired or wireless telecommunication systems.

REFERENCED DOCUMENTS

[DPP]Device Provisioning Protocol—Technical Specification—Version 2.0, Wi-Fi Alliance, 2020, (https://www.wi-fi.org/downloads-public/Wi-Fi_Easy_Connect_Specification_v2.0.pdf/35330)

[ISO 18004]ISO/IEC 18004:2015: Information technology—Automatic identification and data capture techniques: "QR Code bar code symbology specification"

The invention claimed is:

1. A method of encoding information of a plurality of applications for storage in a QR code, the QR code being a single QR code and/or a plurality of linked QR codes, the method comprising at least:
    collecting the information of the plurality of applications; and
    encoding the information into encoded data, the encoded data including at least a header and a respective data container per application, wherein:
        the header comprises at least a single identifier indicating a presence of the plurality of applications and a respective application identifier per application.

2. The method of claim 1, wherein a respective error correction and/or detection mechanism is used for each data container per application in the encoded data of the respective data container per application.

3. The method of claim 1, wherein encoding the information into encoded data comprises at least:
    converting an input data stream of the information into a respective input bit string for each application;
    splitting the respective input bit string for each application into a sequence of one or more data codewords;
    dividing the sequence of one or more data codewords into a predefined number of blocks;
    generating one or more error correction codewords for each block; and
    including the error correction codewords in the data codeword sequence.

4. The method of claim 1, wherein encoding the information into encoded data comprises at least:
    taking a respective data stream from the header for each application;
    combining the respective data stream into a combined respective data stream;
    converting the combined respective data stream into a respective input bit string;
    splitting the respective input bit string into a sequence of one or more data codewords;
    dividing the sequence of one or more data codewords into a predefined number of blocks;
    generating one or more error correction codewords for each block; and
    including the error correction codewords in the data codeword sequence.

5. The method of claim 1, further comprising:
    distributedly storing a part or an entirety of the encoded data in a plurality of data pixels distributed over an encoding region of the QR code, according to an allocation rule.

6. The method of claim 5, further comprising:
    collecting image data from a graphical representation being physically superimposed on the QR code; and
    including, in the header of the encoded data, an indication of a presence of the graphical representation and of an area occupied by the graphical representation on the QR code,
    wherein the data pixels of the encoding region of the QR code that occupy an area in the QR code coinciding with the area occupied by the graphical representation are excluded from storing the part or the entirety of the encoded data.

7. The method of claim 1, wherein data arranged for use with a respective error detection mechanism per application is included in each data container per application.

8. The method of claim 1, wherein the encoded data includes:
    data arranged for use with an overall error detection mechanism shared by all applications of the plurality of applications for detecting whether there are errors in the respective data container based on codewords in other data containers; and/or
    data arranged for use with an overall error correction mechanism shared by all applications of the plurality of applications for correcting errors in the respective data container based on codewords in other data containers.

9. The method of claim 1, wherein the QR code comprises DPP bootstrapping information for storing information at least of a public key.

10. An apparatus for encoding information of a plurality of applications for storage in a QR code, the apparatus being adapted to perform the method of claim 1.

11. A computer program product for a computing device, the computer program product comprising:
    program instructions or code means such that, when the computer program product is run on a processing unit of the computing device, the computing device is arranged to perform the method of claim 1.

12. A method of decoding information of a respective application amongst a plurality of applications in a QR code, the QR code being a single QR code and/or a plurality of linked QR codes, wherein the information is stored as encoded data in the QR code and the encoded data includes at least a header and a respective data container per application, the method comprising at least:
    reading a header of the QR code, the header including at least a single identifier indicating a presence of the plurality of applications and a respective application identifier per application;
    identifying, from the header, the QR code by using the single identifier indicating the presence of the plurality of applications;
    identifying, from the header, the respective application; and
    identifying the respective data container associated with the respective application.

13. The method of claim 12, further comprising:
    reading all those pixels associated with the data container of the respective application to retrieve at least one data codeword associated with the respective application and parity or error detection or error correction bits for all the plurality of applications; and
    obtaining error-free application data of the respective application.

14. The method of claim 12, wherein the information encodes commissioning information for a communication protocol, the method further comprising:

selecting a first commissioning protocol based on at least one of a preconfigured value, a policy, a context, and a part of the data in the QR code.

15. An apparatus for decoding information of a respective application amongst a plurality of applications in a QR code, wherein the information is stored as encoded data in the QR code and the encoded data includes at least a header and a respective data container per application, the apparatus being adapted to perform the method of claim 12.

16. A system comprising at least:
the apparatus of claim 14 comprising a camera and a first communication interface;
a first device having an associated QR code and a second communication interface; a second device having a third communication interface; and
a third device,
wherein the apparatus is adapted to:
interface with the third device; and
start and execute a first commissioning protocol with the first device, and/or wherein the third device is adapted to:
trigger a second commissioning protocol, either identical to or different from the first commissioning protocol, with the first device from the second device.

17. A computer program product for a computing device, the computer program product comprising:
program instructions or code means such that, when the computer program product is run on a processing unit of the computing device, the computing device is arranged to perform the method of claim 12.

18. A device having an associated QR code, the QR code being a single QR code and/or a plurality of linked QR codes and including commissioning information for at least two different commissioning protocols, the commissioning information for each commissioning protocol being stored in a respective container the device, upon reception of an initial commissioning message of a first commissioning protocol from a commissioner device, accepts no initial commissioning message of a second commissioning protocol until the first commissioning protocol finishes.

* * * * *